(12) United States Patent
Hwang et al.

(10) Patent No.: US 9,111,799 B2
(45) Date of Patent: Aug. 18, 2015

(54) SEMICONDUCTOR DEVICE WITH A PICK-UP REGION

(75) Inventors: Sung-Min Hwang, Seoul (KR); Kyoung-Hoon Kim, Yongin-si (KR); Hansoo Kim, Suwon-si (KR); Jae-Joo Shim, Suwon-si (KR); Jaehoon Jang, Seongnam-si (KR); Wonseok Cho, Suwon-si (KR); Byoungkeun Son, Suwon-si (KR); Hoosung Cho, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 494 days.

(21) Appl. No.: 13/109,230

(22) Filed: May 17, 2011

(65) Prior Publication Data

US 2011/0291172 A1    Dec. 1, 2011

(30) Foreign Application Priority Data

May 25, 2010  (KR) .......................... 10-2010-0048795
Nov. 24, 2010  (KR) .......................... 10-2010-0117668

(51) Int. Cl.
| | | |
|---|---|---|
| H01L 29/792 | (2006.01) | |
| H01L 27/115 | (2006.01) | |
| H01L 29/66 | (2006.01) | |

(52) U.S. Cl.
CPC .... *H01L 27/11578* (2013.01); *H01L 27/11551* (2013.01); *H01L 27/11582* (2013.01); *H01L 29/66833* (2013.01); *H01L 29/792* (2013.01); *H01L 29/7926* (2013.01)

(58) Field of Classification Search
CPC ..................... H01L 29/7926; H01L 27/11578; H01L 27/11551
USPC .................. 257/314, 315, 321, 324, E29.309, 257/E21.423, 74, 278, E21.309, E21.614
See application file for complete search history.

(56) References Cited

U.S. PATENT DOCUMENTS

| | | | |
|---|---|---|---|
| 2008/0179659 A1* | 7/2008 | Enda et al. ................... | 257/326 |
| 2009/0242967 A1* | 10/2009 | Katsumata et al. .......... | 257/324 |

FOREIGN PATENT DOCUMENTS

| | | |
|---|---|---|
| JP | 2006-128390 | 5/2006 |
| JP | 2007-317874 | 12/2007 |
| JP | 2009-088446 | 4/2009 |
| JP | 2009-158775 | 7/2009 |
| JP | 2009-224574 | 10/2009 |
| KR | 1020090115288 | 11/2009 |
| KR | 1020100078776 | 7/2010 |

* cited by examiner

*Primary Examiner* — Jesse Y Miyoshi
(74) *Attorney, Agent, or Firm* — F. Chau & Associates, LLC

(57) ABSTRACT

Provided are a semiconductor device and a method of fabricating the same. The semiconductor device includes a substrate doped with a first conductive type dopant, a plurality of stacked structures arranged side by side on the substrate and extending in a first direction, each of the stacked structures including gate electrodes spaced apart from each other, the plurality of stacked structures including a pair of stacked structures spaced apart from each other at a first interval in a second direction perpendicular to the first direction, and a pick-up region extending in the first direction in the substrate between the pair of stacked structures and doped with the first conductive type dopant.

20 Claims, 44 Drawing Sheets

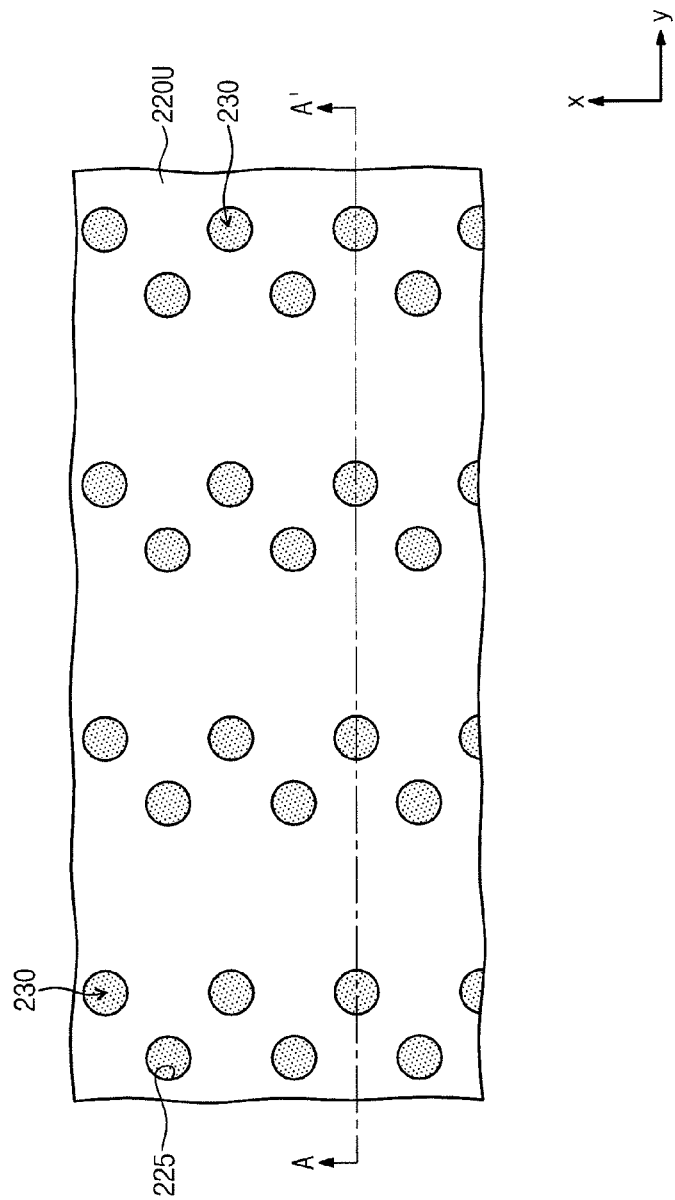

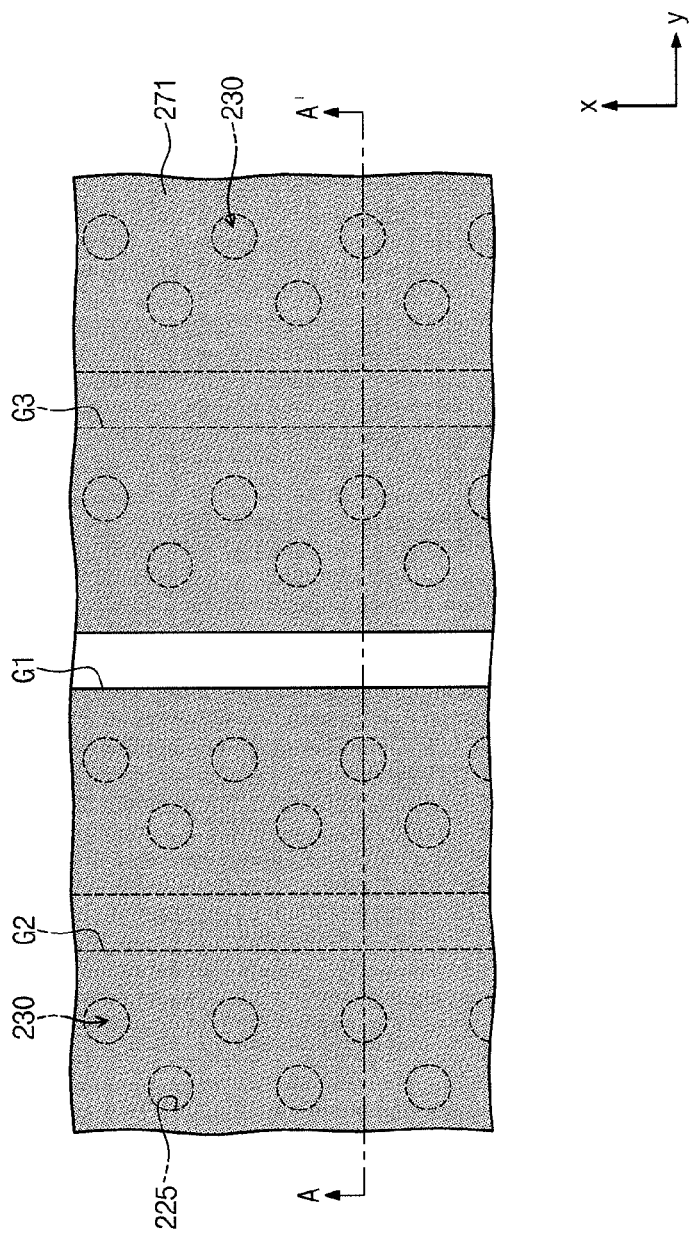

SEMICONDUCTOR DEVICE WITH A PICK-UP REGION

CROSS-REFERENCE TO RELATED APPLICATIONS

This U.S. non-provisional patent application claims priority under 35 U.S.C. §119 of Korean Patent Application Nos. 10-2010-0048795, filed on May 25, 2010, and 10-2010-0117668, filed on Nov. 24, 2010, the entire contents of which are herein incorporated by reference.

BACKGROUND

The present disclosure relates to a semiconductor device and a method of fabricating the semiconductor device.

The degree of integration of a semiconductor memory device is generally determined by the area occupied by a unit memory cell, which is affected by micro-patterning technologies. The high cost of semiconductor manufacturing equipment and difficulties in a semiconductor manufacturing process restrict miniaturization of micro patterns.

SUMMARY

The present disclosure provides a highly-integrated semiconductor device with increased reliability and yield and a method of fabricating the semiconductor device.

An embodiment of the inventive concept provides a semiconductor device including a substrate doped with a first conductive type dopant, a plurality of stacked structures arranged side by side on the substrate and extending in a first direction, each of the stacked structures including gate electrodes spaced apart from each other, the plurality of stacked structures including a pair of stacked structures spaced apart from each other at a first interval in a second direction perpendicular to the first direction, and a pick-up region extending in the first direction in the substrate between the pair of stacked structures and doped with the first conductive type dopant.

According to an embodiment, a concentration of the first conductive type dopant may be higher in the pick-up region than in the substrate.

According to an embodiment, the semiconductor device may further include a pick-up contact pattern connected to the pick-up region and extending in the first direction between the pair of stacked structures.

According to an embodiment, the pick-up contact pattern may have a plate shape perpendicular to a top surface of the substrate.

According to an embodiment, the pair of stacked structures may include first and second stacked structures, and the plurality of stacked structures may further include a third stacked structure adjacent to the second stacked structure and spaced apart from the second stacked structure at a second interval in the second direction, the second interval being narrower than the first interval, further including a second conductive type common source region extending in the first direction in the substrate between the second and third stacked structures.

According to an embodiment, the semiconductor devices may further include a source contact pattern connected to the common source region and extending in the first direction between the second and third stacked structures.

According to an embodiment, the source contact pattern may have a plate shape perpendicular to a top surface of the substrate.

According to an embodiment, the pick-up contact pattern may include a main contact portion and auxiliary contact potions at two sides of the main contact portion, and the auxiliary contact portions may include the same material as the source contact pattern.

According to an embodiment, the semiconductor devices may further include insulation spacers on two sidewalls of each of the plurality of stacked structures.

According to an embodiment, the semiconductor devices may further include second conductive type remaining doping regions extending in the first direction in the substrate between the pair of stacked structures and disposed at two sides of the pick-up region.

According to an embodiment, the plurality of stacked structures may be spaced apart from each other at the first interval in the second direction.

According to an embodiment, the pair of stacked structures may include first and second stacked structures the plurality of stacked structures may include a third stacked structure adjacent to the second stacked structure, further including a common source region extending in the first direction in the substrate between the second and third stacked structures and doped with a second conductive type dopant, wherein the pick-up region and the common source region may have the same width in the second direction.

According to an embodiment, the semiconductor devices may further include a pick-up contact pattern connected to the pick-up region and extending perpendicular to the substrate between the first and second stacked structures, and a source contact pattern connected to the common source region and extending perpendicular to the substrate between the second and third stacked structures, wherein the pick-up contact pattern and the source contact pattern are provided during the same process.

According to an embodiment of the inventive concept, a method of fabricating a semiconductor device includes forming a plurality of stacked structures arranged side by side and extending in a first direction on a substrate doped with a first conductive type dopant, each of the stacked structures including first and second patterns that are alternately and repeatedly stacked, the plurality of stacked structures including a pair of stacked structures spaced apart from each other at a first interval in a second direction perpendicular to the first direction, and forming a pick-up region extending in the first direction in the substrate between the pair of stacked structures and doped with the first conductive type dopant.

According to an embodiment, the forming of the pick-up region may include forming second conductive type doped regions by doping with a second conductive type dopant regions in the substrate between the plurality of stacked structures using the plurality of stacked structures as a mask, and counter-doping with the first conductive type dopant the second conductive type doped region in the substrate between the pair of stacked structures.

According to an embodiment, the pair of stacked structures may include first and second stacked structures, and the plurality of stacked structures may include a third stacked structure adjacent to the second stacked structure, wherein the third stacked structure is spaced apart from the second stacked structure at a second interval narrower than the first interval, further including forming a material layer on the substrate, wherein the material layer fills an area between the second and third stacked structures, and defines an empty space, and performing an anisotropic etching process on the material layer, wherein the counter-doping is performed using the anisotropic etched material layer and the plurality of stacked structures as a mask.

According to an embodiment, the material layer may be a conductive layer.

According to an embodiment, the method further include forming insulation spacers covering sidewalls of the first, second, and third stacked structures, wherein a thickness of the material layer is less than a half of an interval between the insulation spacers disposed between the first and second stacked structures.

According to an embodiment, the method may further include forming a gap fill conductive layer filling an area between the first and second stacked structures.

According to an embodiment, the material layer may be an insulation layer.

According to an embodiment, a thickness of the material layer may be less than a half of the first interval.

According to an embodiment, the forming of the plurality of stacked structures may include alternately and repeatedly stacking sacrificial layers and insulation layers on the substrate, forming semiconductor pillars penetrating the sacrificial layers and the insulation layers, forming a first trench having a first width and a second trench having a second width narrower than the first width to define alternately and repeatedly stacked sacrificial patterns and insulation patterns by continuously patterning the sacrificial layers and the insulation layers, forming recess regions by removing the sacrificial patterns exposed to the first and second trenches, forming an information storage layer on the recess regions, and forming the gate electrodes filling the respective recess regions.

According to an embodiment of the inventive concept, a method of fabricating a semiconductor device includes forming a plurality of stacked structures arranged side by side and extending in a first direction on a substrate doped with a first conductive type dopant, each of the plurality of stacked structures including first and second patterns that are alternately and repeatedly stacked, and wherein gap regions including first and second gap regions are defined between respective adjacent stacked structures of the plurality of stacked structures, forming a hard mask layer including first portion covering top surfaces of the stacked structures and second portions blocking inlets of the gap regions, and removing the second portion blocking the inlet of the first gap region to form a hard mask pattern blocking the inlet of the second gap region.

According to an embodiment, the forming of the hard mask layer may include forming dropping portions filling lower regions of the gap regions, and defining empty voids in the gap regions.

According to an embodiment, the forming of the hard mask pattern may further include removing the dropping portion in the first gap region to expose a lower portion of the first gap region.

According to an embodiment, the method may further include implanting a second conductive type dopant ion into the substrate under the gap regions by using the stacked structures as an ion implantation mask.

According to an embodiment, the method may further include implanting a first conductive type dopant ion into the substrate under the first gap region by using the hard mask pattern as an ion implantation mask.

According to an embodiment, the method may further include removing the hard mask pattern and the dropping portions, forming gap fill insulation patterns filling the gap regions, and forming contact patterns contacting lower portions of the gap regions and penetrating the gap fill insulation patterns.

According to an embodiment, the dropping portions and the hard mask layer may be spaced apart from each other.

According to an embodiment, lowermost surfaces of the second portions may be disposed over the gap regions.

According to an embodiment, part of the second portions may protrude toward the gap regions.

According to an embodiment, the forming of the hard mask pattern may include forming an anti reflection pattern and a photoresist pattern on the hard mask layer, and removing an exposed portion of the hard mask layer by using the anti reflection pattern as a mask.

According to an embodiment, the hard mask layer may include a material having a higher viscosity than a viscosity of the photoresist pattern.

According to an embodiment, the hard mask layer may include a material having a lower degree of filling the gap regions than the photoresist pattern.

According to an embodiment, the hard mask layer may include an amorphous carbon layer.

According to an embodiment, the hard mask layer may include a different material from the first and second patterns.

According to an embodiment, the first gap region and the second gap region may have the same width in a second direction perpendicular to the first direction.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 8A, 9A, 10A, 11A, 12A, 13A, 14A, 15A, 16A, 17A, and 18A are plan views illustrating a method of fabricating a semiconductor device according to an embodiment of the inventive concept;

DETAILED DESCRIPTION OF THE EMBODIMENTS

Figure 1A:
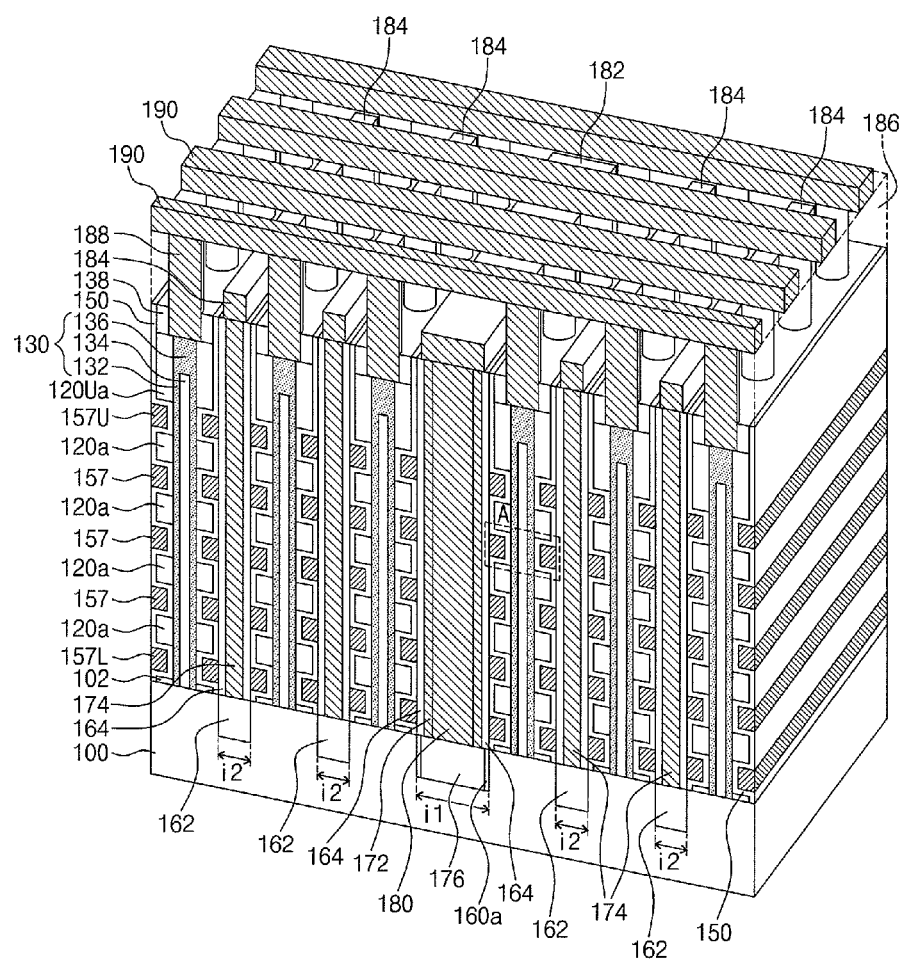
FIGS. 1A and 1B are perspective views illustrating a semiconductor device according to an embodiment of the inventive concept.

Exemplary embodiments of the inventive concept will be described below in more detail with reference to the accompanying drawings, wherein like reference numerals may refer to like or similar elements throughout the specification and the drawings.

Figure 1B:
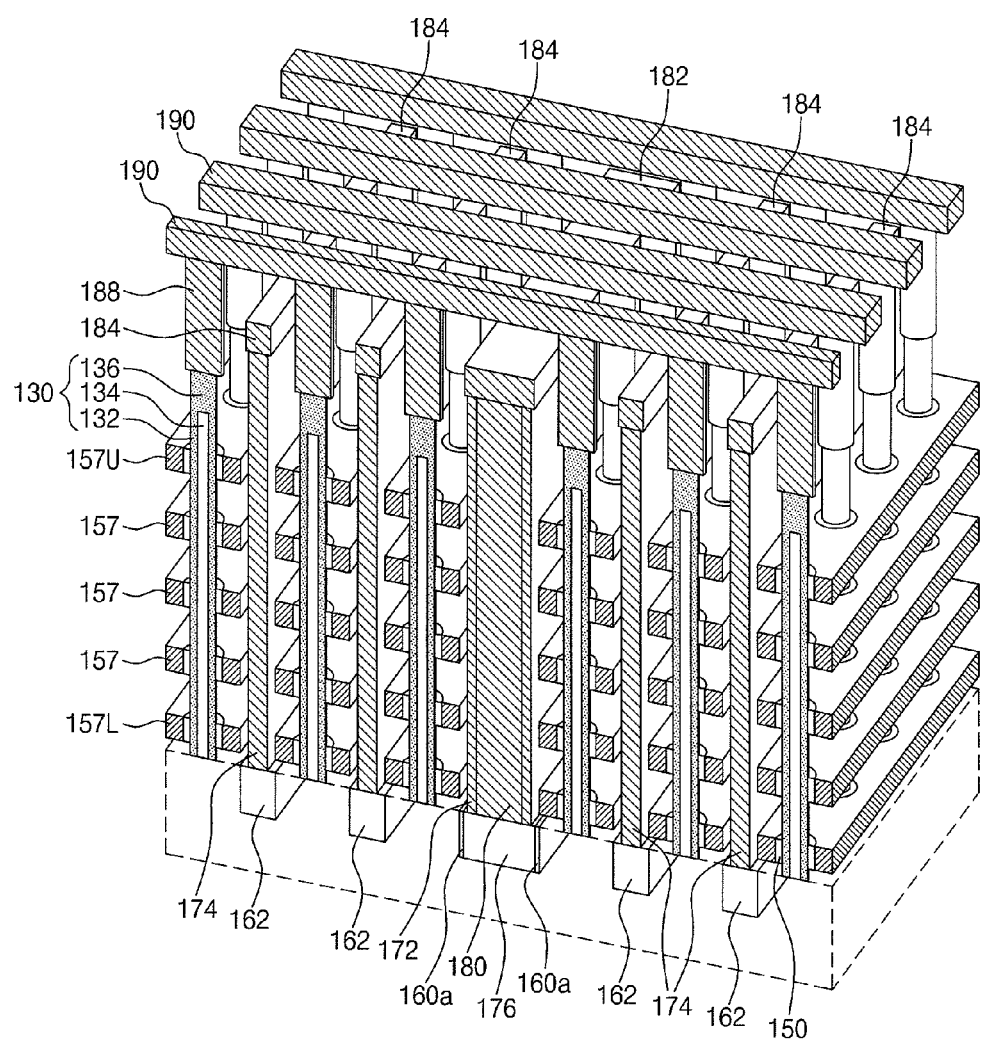
Figure 2:
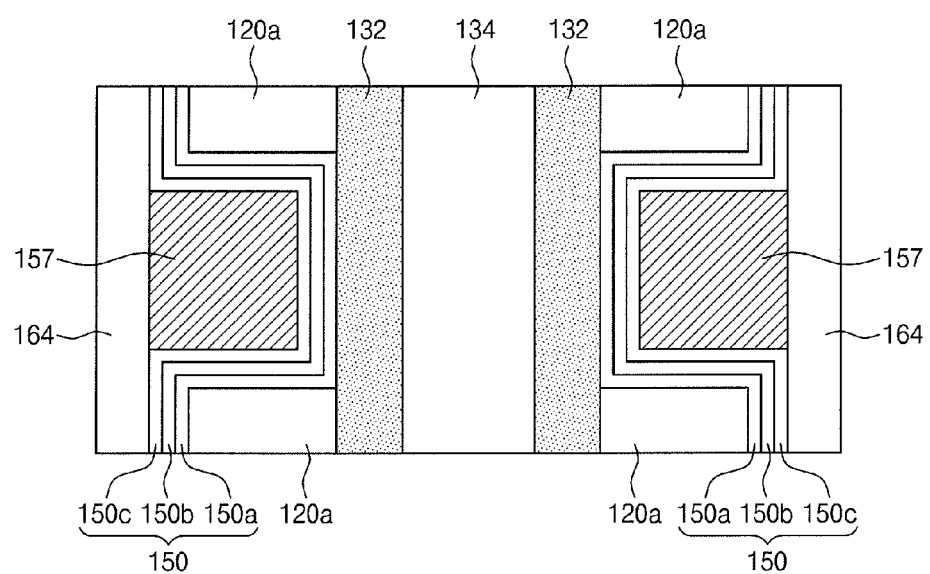
FIG. 2 is an enlarged view of region A of FIG. 1A to describe an information storage layer in the semiconductor device.

A semiconductor device according to an embodiment of the inventive concept is described. FIGS. 1A and 1B are perspective views illustrating a semiconductor device according to an embodiment of the inventive concept. In FIG. 1B, insulation patterns 120a and 120Ua are omitted for convenience of description. FIG. 2 is an enlarged view of region A of FIG. 1A to describe an information storage layer 150 in the semiconductor device.

Referring to FIGS. 1A and 1B, gate electrodes 157L, 157, and 157U and insulation patterns 120a and 120Ua are alternately and repeatedly stacked on a substrate 100. According to an embodiment, the substrate 100 is a semiconductor substrate. According to an embodiment, the substrate 100 is a silicon substrate, a germanium substrate, a silicon-germanium substrate, or a compound semiconductor substrate. The substrate 100 is doped with a first conductive type dopant.

The alternately stacked gate electrodes 157L, 157, and 157U and insulation patterns 120a and 120Ua constitute a stacked structure. A plurality of stacked structures, each extending in a first direction, are disposed side by side on the substrate 100 in a second direction. The first direction is parallel to a top surface of the substrate 100 and is perpendicular to the second direction. The gate electrodes 157L, 157, and 157U and insulation patterns 120a and 120Ua are arranged side by side and extend in the first direction. The plurality of stacked structures are spaced apart from each other in a second direction. The second direction is parallel to a top surface of the substrate 100.

The insulation patterns 120a and 120Ua include an oxide. For example, the insulation patterns 120a and 120Ua include a silicon oxide. The gate electrodes 157L, 157, and 157U include a conductive material. For example, the gate electrodes 157L, 157, and 157U include at least one of metals (e.g., tungsten, aluminum, titanium, tantalum, etc.), conductive metal nitrides (e.g., titanium nitride, tantalum nitride, etc.), and doped semiconductor materials (e.g., doped silicon, doped germanium, doped silicon germanium, etc.).

The plurality of stacked structures include first, second, and third stacked structures spaced apart from each other in the second direction. The first and second stacked structures are spaced apart from each other at a first interval i1. The third stacked structure is adjacent to the second stacked structure. The third stacked structure and the second stacked structure are spaced apart from each other at a second interval i2. The second interval i2 is narrower than the first interval i1.

A pick-up region 176 is disposed in the substrate 100 between the first and second stacked structures. The pick-up region 176 extends in the first direction in the substrate 10. The pick-up region 176 is doped with the first conductive type dopant. A concentration of the first conductive type dopant is higher in the pick-up region 176 than in the substrate 100. The pick-up region 176 has the same first conductive type as the substrate 100 and the pick-up region 176 and the substrate 100 are electrically connected to each other. According to an embodiment of the inventive concept, a voltage may be stably supplied to the substrate 100 through the pick-up region 176. The pick-up region 176 is doped with a second conductive type in the substrate 100 and counter-doped with the first conductive type dopant.

Remaining doping regions 160a are disposed in the substrate 100 between the first and second stacked structures. The remaining doping regions 160a extend in the first direction in the substrate 100 and are disposed at two sides of the pick-up region 176. The remaining doping regions 160a are doped with the first conductive type dopant and counter-doped with the second conductive type dopant. In the case that the pick-up region 176 is formed by counter-doping a region, the remaining doping regions 160a are left as a part of the region without being counter-doped. According to an embodiment, when the first conductive type dopant in the pick-up region 176 is sufficiently activated, the remaining doping regions 160a may not be included.

A common source region 162 is disposed in the substrate 100 between the second and third stacked structures. The common source region 162 extends in the first direction in the substrate 100. The common source region 162 is counter-doped with the second conductive type dopant. A width of the common source region 162 in the second direction is the same or substantially the same as the second interval i2. According to an embodiment, a width of the common source region 162 in the second direction is broader than the second interval i2, and may be substantially broader than the second interval i2.

Pick-up contact pattern 172 and 180 and a source contact pattern 174 connected to the pick-up region 176 and the common source region 162, respectively, are disposed. The pick-up contact pattern 172 and 180 and the source contact pattern 174 each include a flat plate extending from a top surface of the substrate 100. The pick-up contact pattern 172 and 180 and the source contact pattern 174 have a fin shape vertical (i.e., perpendicular) to the top surface of the substrate 100. Top surfaces of the pick-up contact pattern 172 and 180 and the source contact pattern 174 are coplanar with top surfaces of capping insulation patterns 138 on uppermost insulation patterns 120Ua.

The pick-up contact pattern 172 and 180 extends in the first direction between the first stacked structure and the second stacked structure. The pick-up contact pattern 172 and 180 is disposed on the substrate 100 between a side of the first stacked structure and a side of the second stacked structure which face each other. The pick-up contact pattern 172 and 180 contacts the pick-up region 176 and do not contact the remaining doping regions 160a. According to an embodiment, the pick-up contact pattern 172 and 180 contacts the pick-up region 176 and the remaining doping regions 160a. In the second direction, a width of the pick-up contact pattern 172 and 180 is narrower than a width of the pick-up region 176. According to an embodiment, in the second direction, a width of the pick-up contact pattern 172 and 180 is the same or substantially the same as a width of the pick-up region 176.

The pick-up contact pattern 172 and 180 includes a main contact portion 180 and auxiliary contact portions 172. The auxiliary contact portions 172 are disposed at two sides of the main contact portion 180. The main contact portion 180 and the auxiliary contact portions 172 are provided by different processes from each other. A discontinuous boundary does not exist between the main contact portion 180 and the auxiliary contact portions 172.

Each of the auxiliary contact portions 172 includes a portion doped with the first conductive type dopant. The first conductive type dopant is injected in the auxiliary contact portions 172 while doping the pick-up region 176 with the first conductive type dopant. The auxiliary contact portions 172 and the source contact pattern 174 are provided by the same process. The auxiliary contact portions 172 and the source contact pattern 174 include the same material.

The source contact pattern 174 extends in the first direction between the second stacked structure and the third stacked structure. For example, the source contact pattern 174 is disposed on the substrate 100 between a side of the second stacked structure and a of the third stacked structure which face each other. The source contact pattern 174 contacts the common source region 162. In the second direction, a width of the source contact pattern 174 is narrower than a width of the common source region 162. The source contact pattern 174 includes a portion doped with the first conductive type dopant. The first conductive type dopant is injected into the source contact pattern 174 while doping the pick-up region 176 with the first conductive type dopant.

The pick-up contact pattern 172 and 180 and the source contact pattern 174 include a conductive material. For example, the pick-up contact pattern 172 and 180 and the source contact pattern 174 include at least one of metals (e.g., tungsten, aluminum, titanium, tantalum, etc.), conductive metal nitrides (e.g., titanium nitride, tantalum nitride, etc.), and doped semiconductor materials (e.g., doped silicon, doped germanium, doped silicon germanium, etc.).

Spacers 164 are disposed between the first stacked structure and pick-up contact pattern 172 and 180, between the second stacked structure and pick-up contact pattern 172 and 180, between the second stacked structure and a source contact pattern 174, and between the third stacked structure and a source contact pattern 174. By the spacers 164, the pick-up contact patterns 172 and 180 and the source contact pattern 174 are spaced apart from the gate electrodes 157L, 157, and 157U in the stacked structures. The spacers 164 are disposed on sidewalls of the first, second, and third stacked structures.

Bottom surfaces of the spacers 164 between the first and second stacked structures contact the pick-up region 176 and/or the remaining doping regions 160a. Bottom surfaces of the spacers 164 between the second and third stacked structures contact the common source region 162. Each of the spacers 164 is formed of one of an oxide, a nitride, and an oxynitride.

A semiconductor pillar 130 penetrates the alternately and repeatedly stacked gate electrodes 157L, 157, and 157U and insulation patterns 120a and 120Ua. The semiconductor pillar 130 extends in a third direction vertical (i.e., perpendicular) to the first and second directions. The third direction is vertical to a top surface of the substrate 100. A plurality of semiconductor pillars 130 are provided on the substrate 100. The plurality of semiconductor pillars 130 are two-dimensionally arranged along the first direction and the second direction. A plurality of semiconductor pillars 130 penetrate each stacked structure. A plurality of semiconductor pillars 130 penetrating a stacked structure are spaced apart from a plurality of semiconductor pillars 130 penetrating another stacked structure in the second direction.

Each of the semiconductor pillars 130 includes a vertical-type semiconductor pattern 132, a filling dielectric pattern 134, and a capping semiconductor pattern 136. The vertical-type semiconductor pattern 132 covers a sidewall of a channel opening 125 penetrating the alternately and repeatedly gate electrodes 157L, 157, and 157U and insulation patterns 120a and 120Ua. The filling dielectric pattern 134 fills an inner space surrounded by the vertical-type semiconductor pattern 132 in the channel opening 125. The capping semiconductor pattern 136 fills an upper region of the channel opening 125.

The vertical-type semiconductor pattern 132 and the capping semiconductor pattern 136 include a single crystal or polycrystalline semiconductor material. The capping semiconductor pattern 136 is doped with the second conductive type dopant. The filling dielectric pattern 134 includes a silicon oxide layer and/or a silicon nitride layer. According to an embodiment, each of the semiconductor pillars 130 may be formed of a semiconductor material that completely fills the channel opening 125.

Each of the semiconductor pillars 130, the gate electrode 157L, 157, and 157U surrounding each of the semiconductor pillars 130, and an information storage layer 150 interposed between each of the semiconductor pillars 130 and the gate electrodes 157L, 157, and 157U are included in a vertical-type cell string. The vertical-type cell string includes a lower selection transistor, a plurality of memory cells, and an upper selection transistor, which are connected in series to each other and stacked. Among the gate electrodes 157L, 157, and 157U, the lowermost gate electrode 157L corresponds to a gate of the lower selection transistor, and the uppermost gate electrode 157U corresponds to a gate of the upper selection transistor. Gate electrodes 157 between the lowermost and uppermost gate electrodes 157L and 157U correspond to gates of the memory cells, respectively.

The information storage layer 150 includes a multilayer. An information storage layer 150 in a semiconductor device according to an embodiment of the inventive concept will be described with reference to FIG. 2.

Referring to FIG. 2, the information storage layer 150 includes a tunnel dielectric layer 150a, a charge storage layer 150b, and a blocking layer 150c. The tunnel dielectric layer 150a covers a sidewall of the semiconductor pillar 130. The tunnel dielectric layer 150a is a single layer or a multilayer. For example, the tunnel dielectric layer 150a includes at least one of a silicon oxynitride layer, a silicon nitride layer, a silicon oxide layer, and a metal oxide layer.

The charge storage layer 150b covers the tunnel dielectric layer 150a. The tunnel dielectric layer 150a is interposed between the charge storage layer 150b and the semiconductor pillar 130. The charge storage layer 150b includes a charge trap site for storing charges. For example, the charge storage layer 150b includes at least one of a silicon nitride layer, a metal nitride layer, a metal oxynitride layer, a metal silicon oxide layer, a metal silicon oxynitride layer, and nano dots.

The blocking layer 150c covers the charge storage layer 150b. The charge storage layer 150b is disposed between the blocking layer 150c and the tunnel dielectric layer 150a. The blocking layer 150c includes at least one of a silicon oxide layer, a silicon oxynitride layer, and a high dielectric layer. The high dielectric layer includes at least one of a metal oxide layer, a metal nitride layer, and a metal oxynitride layer. The high dielectric layer includes Hf, Zr, Al, Ta, Pa, Ce, and Pr. A dielectric constant of the blocking layer 150c is greater than a dielectric constant of the tunnel insulation layer 150a.

The information storage layer 150 between the gate electrode 157 and the semiconductor pillar 130 corresponds to a data storage element of the memory cell. The information storage layer 150 between the lowermost gate electrode 157L and the semiconductor pillar 130 is included in a first gate insulation layer of the lower selection transistor. A buffer dielectric layer 102 and the information storage layer 150 between the lowermost gate electrode 157L and the substrate 100 are included in a second gate insulation layer of the lower selection transistor. The lowermost gate electrode 157L controls an electrical connection between the common source region 162 and the semiconductor pillar 130. The information storage layer 150 between the uppermost gate electrode 157U and the semiconductor pillar 130 is included in a gate insulation layer of the upper selection transistor.

A first conductive line 182 is electrically connected to the pick-up contact patterns 172 and 180. The first conductive line 182 is disposed on the pick-up contact patterns 172 and 180 and extends along the pick-up contact patterns 172 and 180 in the first direction. A second conductive line 184 is electrically connected to the source contact pattern 174. The second conductive line 184 is disposed on the source contact pattern 174 and extends along the source contact pattern 174 in the first direction. The first conductive line 182 and the second conductive line 184 are parallel to each other.

A bit line 190 is electrically connected to the capping semiconductor pattern 136. The uppermost gate electrodes 157U control an electrical connection between the bit line 190 and the vertical-type cell string. The bit line 190 extends in the second direction. For example, the bit line 190 crosses over the gate electrodes 157L, 157, and 157U. A plurality of bit lines 190 are disposed on the substrate 100. The plurality of bit lines 190 are parallel to each other. A bit line 190 is electrically connected to capping semiconductor patterns 136 of a column of semiconductor pillars 130 arranged in the second direction. The bit line 190 is electrically connected to the capping semiconductor pattern 136 through A bit line contact plug 188 penetrating the capping insulation pattern 138 and an interlayer insulation layer 186 on the stacked structures.

A method of fabricating a semiconductor device according to an embodiment of the inventive concept will be described. FIGS. 3A through 3J are perspective views illustrating a method of fabricating a semiconductor device according to an embodiment of the inventive concept.

Figure 3A:
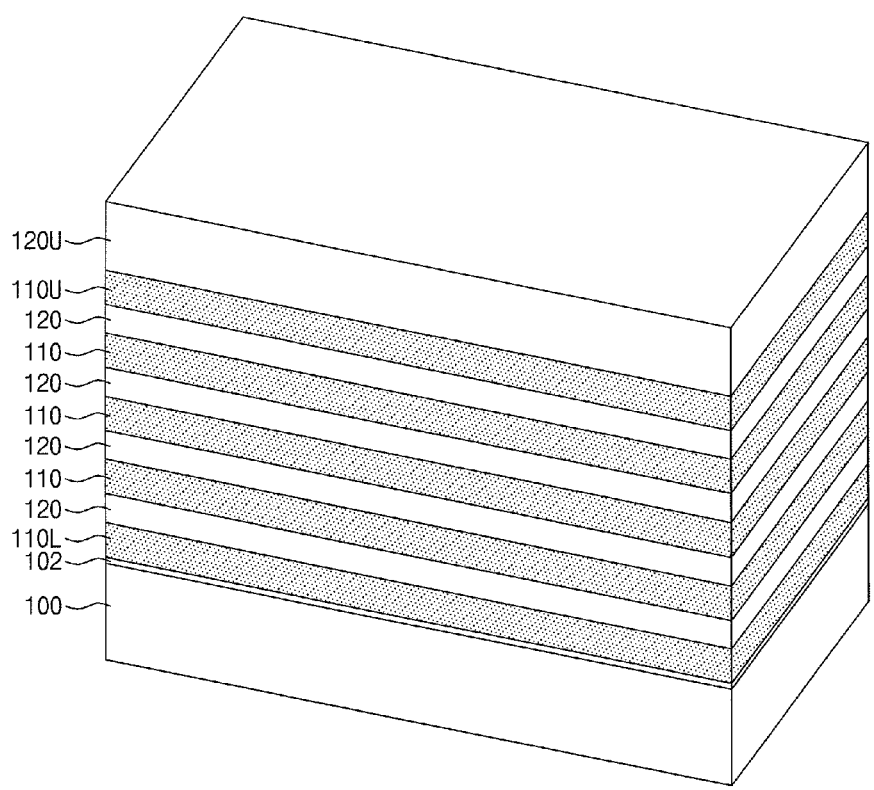
FIGS. 3A through 3J are perspective views illustrating a method of fabricating a semiconductor device according to an embodiment of the inventive concept.

Referring to FIG. 3A, sacrificial layers 110L, 110, and 110U and insulation layers 120 and 120U are alternately and repeatedly stacked on the substrate 100. The substrate 100 is a semiconductor substrate. For example, the substrate 100 is a silicon substrate, a germanium substrate, a silicon-germanium substrate, or a compound semiconductor substrate. The substrate 100 is doped with a first conductive type dopant.

The sacrificial layers 110L, 110, and 110U are formed of a material having a predetermined etch selectivity with respect to the insulation layers 120 and 120U. For example, the insulation layers 120 and 120U include an oxide, and the sacrificial layers 110L, 110, and 110U include a nitride and/or an oxynitride. The sacrificial layers 110L, 110, and 110U are formed of the same material. According to an embodiment, the insulation layers 120 and 120U may be formed of the same material.

The sacrificial layers 110L, 110, and 110U are formed with the same thickness. According to an embodiment, a lowermost sacrificial layer 110L and an uppermost sacrificial layer 110U among the sacrificial layers 110L, 110, and 110U are formed thicker than the sacrificial layers 110 between the lowermost sacrificial layer 110L and the uppermost sacrificial layer 110U. According to an embodiment, the sacrificial layers 110 between the lowermost sacrificial layer 110L and the uppermost sacrificial layer 110U may be formed with the same thickness. An uppermost insulation layer 120U among the insulation layers 120 and 120U is formed thicker than the insulation layers 120 under the uppermost insulation layer 120U. The insulation layers 120 under the uppermost insulation layer 120U are formed with the same thickness.

Before the forming of the sacrificial layers 110L, 110, and 110U and the insulation layers 120 and 120U, a buffer dielectric layer 102 is formed on the substrate 100. The sacrificial layers 110L, 110, and 110U and the insulation layers 120 and 120U are formed on the buffer dielectric layer 102. The lowermost sacrificial layer 110L is directly formed on the buffer dielectric layer 102. The buffer dielectric layer 102 is formed of a dielectric material having a predetermined etch selectivity with respect to the sacrificial layers 110L, 110, and 110U. For example, the buffer dielectric layer 102 is formed of an oxide, e.g., a thermal oxide.

Figure 3B:
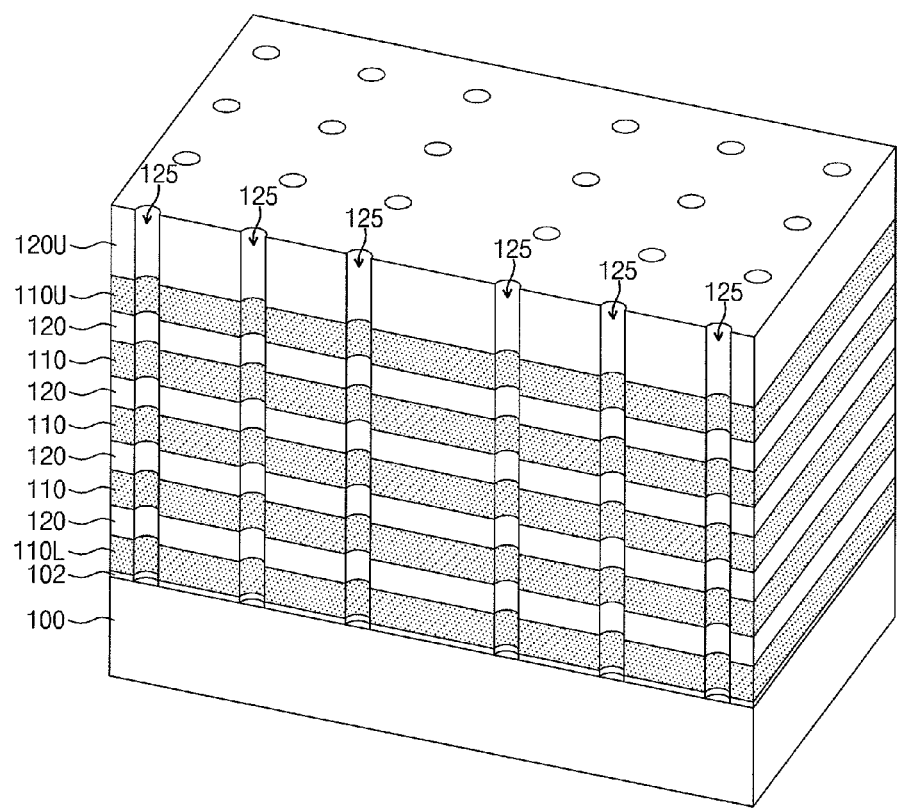

Referring to FIG. 3B, channel openings 125 penetrating the insulation layers 120U and 120, the sacrificial layers 110U, 110, and 110L, and the buffer dielectric layer 102 are formed. Bottom portions of the channel openings 125 are located on a top surface of the substrate 100. The channel openings 125 are formed using an anisotropic etching process. The channel openings 125 have a hole shape. The channel openings 125 are spaced apart from each other. The channel openings 125 are two-dimensionally arranged along a first direction and a second direction perpendicular to the first direction. The first direction and the second direction are parallel to a top surface of the substrate 100. The channel opening 125 has a circular, elliptical, or polygonal shape in a plan view. The channel openings 125 arranged in the first direction constitute a row and the channel openings 125 arranged in the second direction constitute a column. In the columns, an interval between a pair of adjacent columns is broader than an interval between another pair of adjacent columns.

Figure 3C:
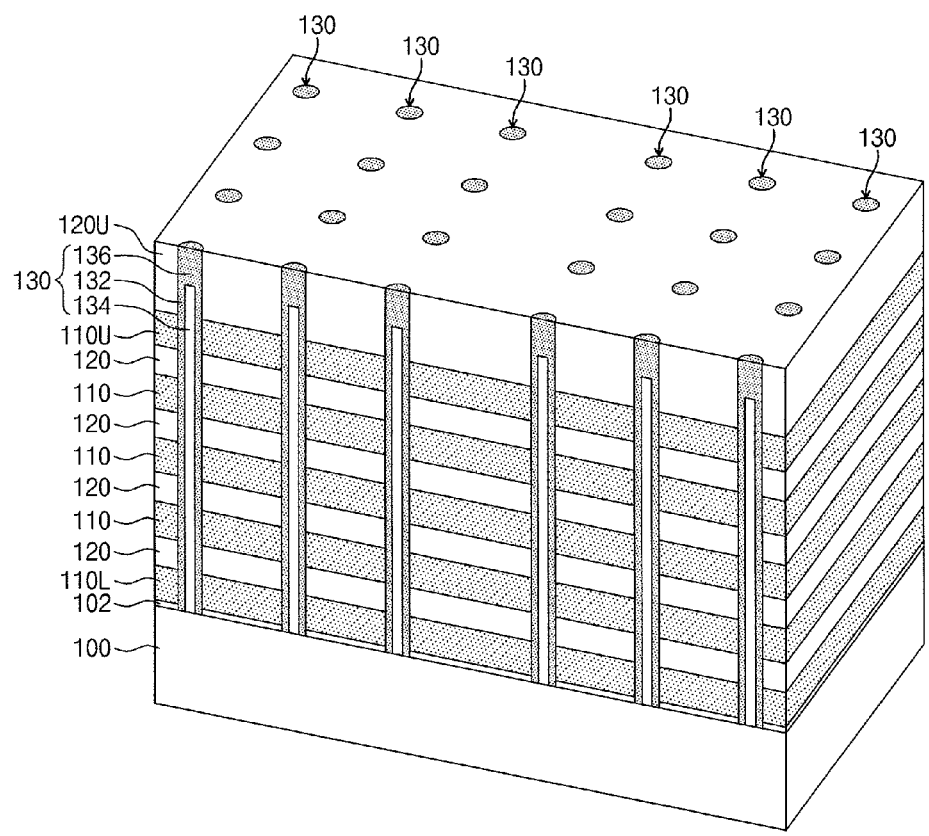

Referring to FIG. 3C, a semiconductor pillar 130 is formed in the channel openings 125. The semiconductor pillar 130 contacts a top surface of the substrate 100 corresponding to the bottom surface of the channel opening 125. The forming of the semiconductor pillar 130 includes forming a vertical-type semiconductor pattern 132 covering a sidewall and a bottom surface of the channel opening 125, filling with a filling dielectric pattern 134 an inner space surrounded by the vertical-type semiconductor pattern 132 in the channel opening 125, removing a portion of the filling dielectric pattern 134 in an upper region of the channel opening 125, and forming a capping semiconductor pattern 136 filling an upper region of the channel opening 125. According to an embodiment, the entire channel opening 125 is filled with a semiconductor material.

The vertical-type semiconductor pattern 132 and the capping semiconductor pattern 136 include the same semiconductor element as the substrate 100. For example, if the substrate 100 is a silicon substrate, the vertical-type semiconductor pattern 132 and the capping semiconductor pattern 136 include silicon. The vertical-type semiconductor pattern 132 is doped with a first conductive type dopant or is undoped. At least a portion of the capping semiconductor pattern 136 is doped with a second conductive type dopant different from the first conductive type dopant.

The vertical-type semiconductor pattern 132 and the capping semiconductor pattern 136 are in a crystalline or amorphous state. If the vertical-type semiconductor pattern 132 and the capping semiconductor pattern 136 are in an amorphous state, a crystallization process is performed on the vertical-type semiconductor pattern 132 and the capping semiconductor pattern 136. For example, the crystallization process includes applying heat or a laser beam to the vertical-type semiconductor pattern 132 and the capping semiconductor pattern 136.

Figure 3D:
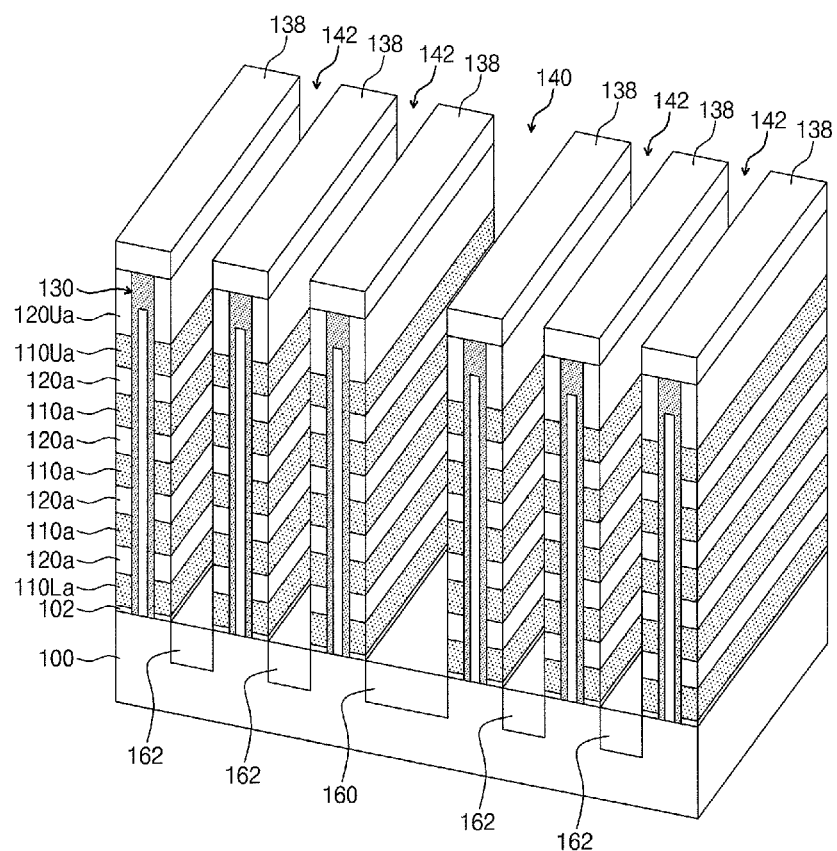

Referring to FIG. 3D, a first trench 140 and second trenches 142 are obtained by continuously patterning the insulation layers 120U and 120 and the sacrificial layers 110U, 110, and 110L. In the second direction, the first trench 140 has a first width, and the second trench 142 has a second width. The first width is greater than the second width.

The first and second trenches 140 and 142 define sacrificial patterns 110La, 110*a*, and 110Ua and insulation patterns 120*a* and 120Ua, which are alternately and repeatedly stacked. The first and second trenches 140 and 142 are formed by using an anisotropic etching process. The first and second trenches 140 and 142 are arranged side by side and extend in the first direction. The sacrificial patterns 110La, 110a, and 110Ua and the insulation patterns 120a and 120Ua have line shapes arranged side by side and extending in the first direction. The alternately and repeatedly stacked sacrificial patterns 110La, 110a, and 110Ua and insulation patterns 120a and 120Ua are spaced apart from each other in the second direction.

Semiconductor pillars 130 arranged in the first direction constitute a row and the semiconductor pillars 130 arranged in the second direction constitute a column. A plurality of rows and columns are arranged on the substrate 100. Each of the first and second trenches 140 and 142 is disposed between a pair of adjacent rows. Semiconductor pillars 138 in a row penetrate a stacked structure including alternately and repeatedly stacked sacrificial patterns 110La, 110a, and 110Ua and insulation patterns 120a and 120Ua.

The sacrificial patterns 110La, 110a, and 110Ua and insulation patterns 120a and 120Ua are exposed to side portions of the first and second trenches 140 and 142. The top surface of the substrate layer 100 is exposed to lower portions of the first and second trenches 140 and 142. According to an embodiment, during the forming of the first and second trenches 140 and 142, the buffer dielectric layer 102 is not etched so that the buffer dielectric layer 102 is exposed to lower portions of the first and second trenches 140 and 142. Hereafter, for convenience of description, an embodiment where the substrate 100 is exposed to lower portions of the first and second trenches 140 and 142 will be described.

Before the forming of the first and second trenches 140 and 142, a capping insulation layer is formed. The capping insulation layer is patterned together with the insulation patterns 120a and 120Ua and the sacrificial patterns 110La, 110a, and 110Ua, so that capping insulation patterns 138 are formed on the alternately and repeatedly stacked sacrificial patterns 110La, 110a, and 110Ua and insulation patterns 120a and 120Ua.

Using the stacked sacrificial patterns 110La, 110a, and 110Ua, insulation patterns 120a and 120Ua, and capping insulation patterns 138 as a mask, a second conductive type dopant is provided in the substrate 100. If the buffer dielectric layer 102 is formed under the lower portions of the first and second trenches 140 and 142, the buffer dielectric layer 102 is used as an ion implantation buffer layer of the second conductive type dopant.

The second conductive type dopant is provided so that a dummy doping region 160 is formed in the substrate 100 under the first trench 140 and common source regions 162 are formed in the substrate 100 under the second trenches 142. The dummy doping region 160 and the common source regions 162 are formed by counter-doping the first conductive type substrate 100 with the second conductive type dopant. The dummy doping region 160 extends in the first direction in the substrate 100 under the first trench 140. The common source regions 162 extend in the first direction in the substrate 100 under the second trenches 142.

Figure 3E:
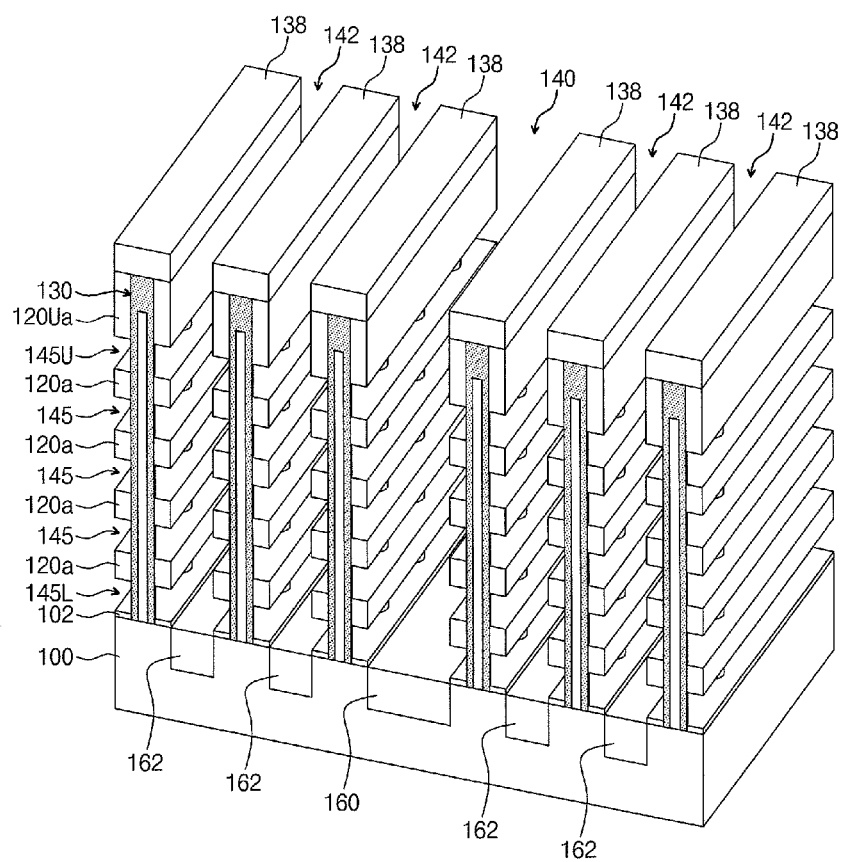

Referring to FIG. 3E, the sacrificial patterns 110La, 110a, and 110Ua exposed to the first and second trenches 140 and 142 are removed through a selective etching process, so that recess regions 145L, 145, and 145U are formed. The selective etching process is isotropic etching. The selective etching process is performed through wet etching and/or isotropic dry etching. An etching rate of the sacrificial patterns 110La, 110a, and 110Ua by the selective etching process is greater than an etching rate of the insulation patterns 120a and 120Ua, the buffer dielectric layer 102, and the semiconductor pillar 130 by the selective etching process. Accordingly, after performing of the selective etching process, the insulation patterns 120a and 120Ua, the buffer dielectric layer 102, and the semiconductor pillar 138 remain. According to an embodiment, the buffer dielectric layer 102 is removed by the selective etching process.

The recess regions 145L, 145, and 145U respectively expose portions of the sidewalls of the semiconductor pillar 130. A lowermost recess region 145L among the recess regions 145L, 145, and 145U is formed by removing the lowermost sacrificial pattern 110La, and an uppermost recess region 145U is formed by removing the uppermost sacrificial pattern 110Ua. The recess regions 145 between the lowermost and uppermost recess regions 145L and 145U are formed by removing the sacrificial patterns 110a between the lowermost and uppermost sacrificial patterns 110La and 110Ua. A lower portion of the lowermost recess region 145L is formed at a portion of the buffer dielectric layer 102.

Figure 3F:
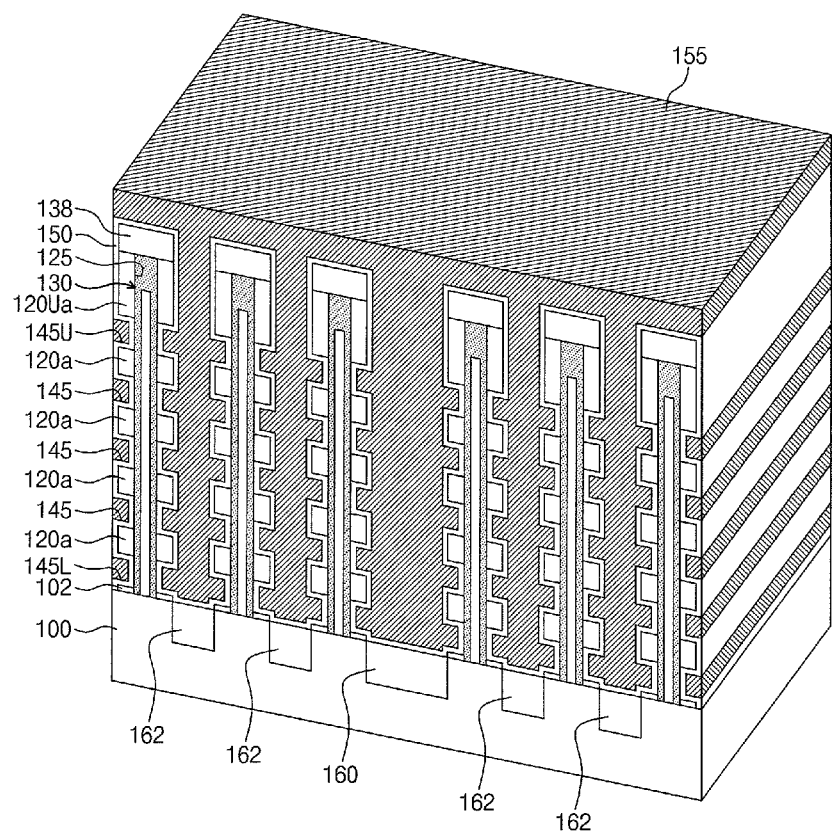

Referring to FIG. 3F, after the forming of the recess regions 145L, 145, and 145U, an information storage layer 150 is formed on the substrate 100. The information storage layer 150 is formed using a deposition technique (e.g., a chemical vapor deposition method or an atomic layer deposition layer) providing step coverage. Thereby, the information storage layer 150 is conformally formed. The information storage layer 150 is formed with substantially a uniform thickness along inner surfaces of the recess regions 145L, 145, and 145U. The information storage layer 150 fills portions of the recess regions 145L, 145, and 145U. The information storage layer 150 is obtained by sequentially forming the tunnel dielectric layer 150a, the charge storage layer 150b, and the blocking layer 150c, as described with reference to FIG. 2.

After the forming of the information storage layer 150, a gate conductive layer 155 is formed on the substrate 100. The gate conductive layer 155 fills the recess regions 145L, 145, and 145U. The gate conductive layer 155 fills some or all of first and second trenches 140 and 142. The gate conductive layer 155 is electrically insulated from the semiconductor pillars 130 and the substrate 100 by the information storage layer 150. The gate conductive layer 155 is formed through a chemical vapor deposition method, a physical vapor deposition method, or an atomic layer chemical deposition layer. The gate conductive layer 155 includes at least one of metals, a metal silicide, a conductive metal nitride, and doped semiconductor materials.

Figure 3G:
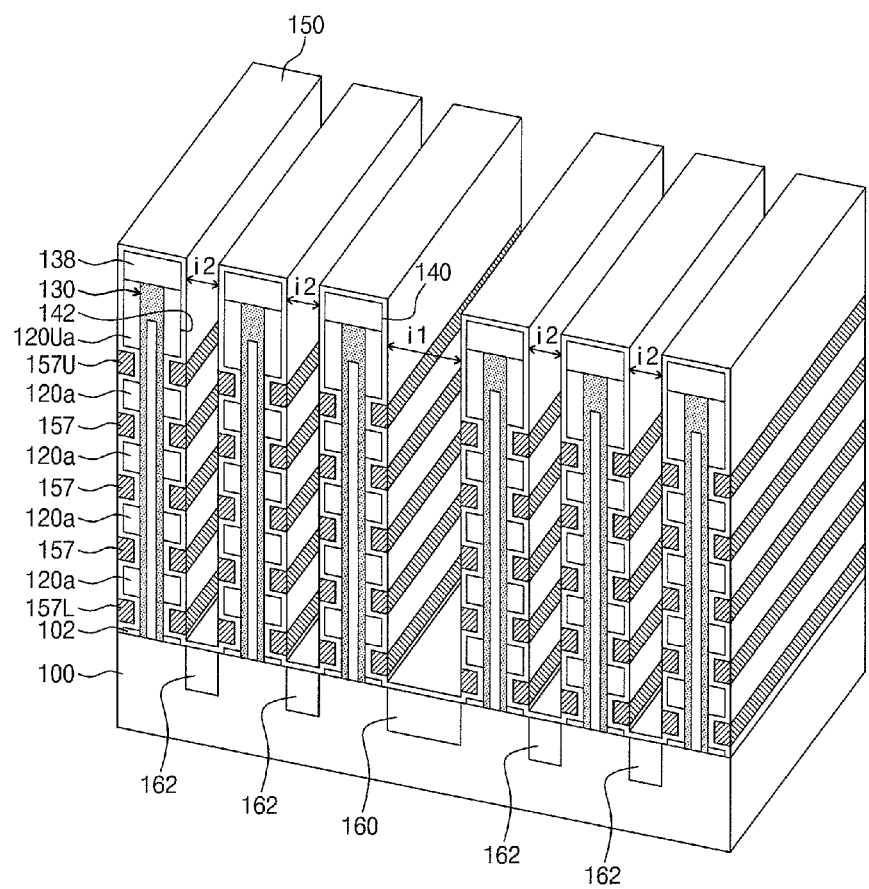

Referring to FIG. 3G, after the forming of the gate conductive layer 155, gate electrodes 157L, 157, and 157U are formed in the recess regions 145L, 145, and 145U by removing the gate conductive layer 155 from an area outside of the recess regions 145L, 145, and 145U through, for example, a wet etching and/or dry etching process.

The gate electrodes 157L, 157, and 157U respectively correspond to portions of the gate conductive layers 155 in the recess regions 145L, 145, and 145U. A lowermost gate electrode 157L among the gate electrodes 157L, 157, and 157U corresponds to a gate of a lower selection transistor and an uppermost gate electrode 157U corresponds to a gate of an upper selection transistor. The gate electrodes 157 between the lowermost and uppermost gate electrodes 157L and 157U correspond to control gates of the memory cells, respectively.

The alternately stacked gate electrodes 157L, 157, and 157U and insulation patterns 120a and 120Ua are defined as a stacked structure. A plurality of stacked structures extending in the first direction are spaced apart from each other in the second direction and are disposed on the substrate 100. The plurality of stacked structures include first, second, and third stacked structures. The first and second stacked structures are spaced apart from each other at a first interval i1. The third stacked structure is adjacent to the second stacked structure, and the second and third stacked structures are spaced apart from each other at a second interval i2. The first interval i1 is greater than the second interval i2. Lower portions of the first trench 140 and the second trench 142 are formed on the information storage layer 150. According to an embodiment, the lower portions of the first trench 140 and the second trench 142 are formed on a top surface of the substrate 100. For convenience of description, in this embodiment, an example where the lower portions of the first and second trenches 140 and 142 are formed on the information storage layer 150 will be described.

Figure 3H:
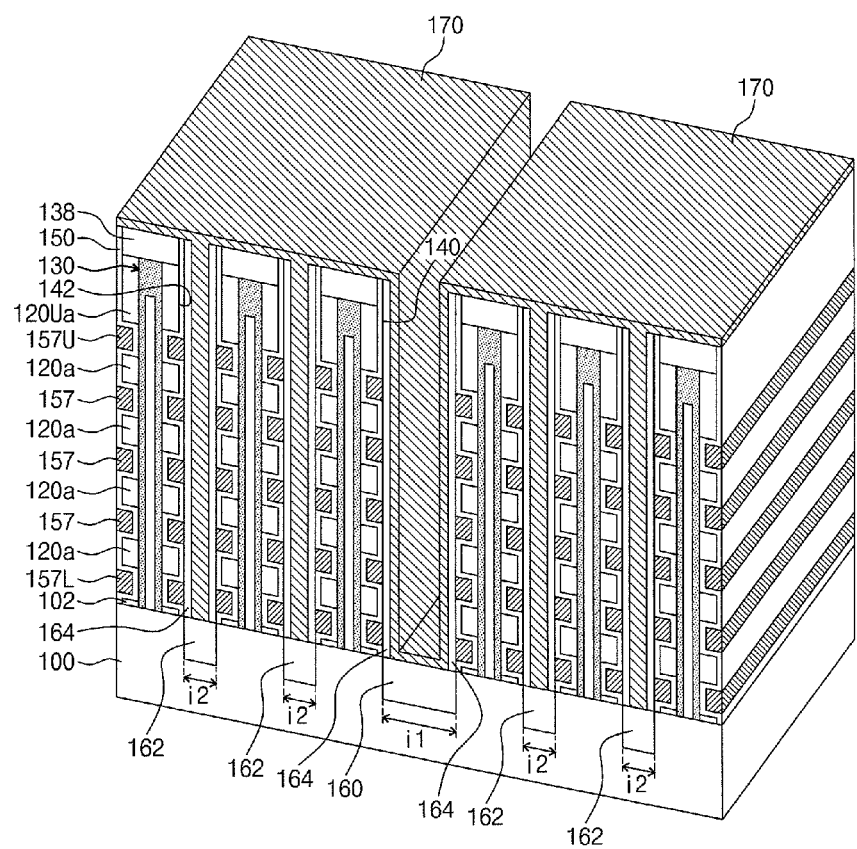

Referring to FIG. 3G and FIG. 3H, the information storage layer 150 covering the top surface of the substrate 100 and the top surfaces of the capping insulation patterns 138 is removed so that the top surfaces of the substrate 100, the first, second, and third stacked structures are exposed. Spacers 164 covering sidewalls of the first, second, and third stacked structures are formed. The spacers 164 are formed by conformally forming a spacer layer on the substrate 100, the first, second, and third stacked structures and by etching the spacer layer. A thickness of the spacer layer is less than a half of the second interval i2. The spacer layer is anisotropically etched. The spacer layer is formed of an insulation material. Empty inner spaces between the spacers 164 are defined in the first and second trenches 140 and 142.

After the forming of the spacers 164, a material layer is formed on the substrate 100. The material layer is a first conductive layer 170. The first conductive layer 170 contacts the dummy doping region 160 and the common source regions 162. The first conductive layer 170 is spaced apart from the gate electrodes 157L, 157, and 157U by the spacers 164.

A thickness of the first conductive layer 170 is less than a half of an interval between the spacers 164 in the first trench 140. As a consequence, the first conductive layer 170 does not completely fill the empty inner space surrounded by the spacers 164 in the first trench 140 and completely fills the empty inner space surrounded by the spacers 164 in the second trench 142. An empty inner space surrounded by the first conductive layer 170 is defined in the first trench 140.

Figure 3I:
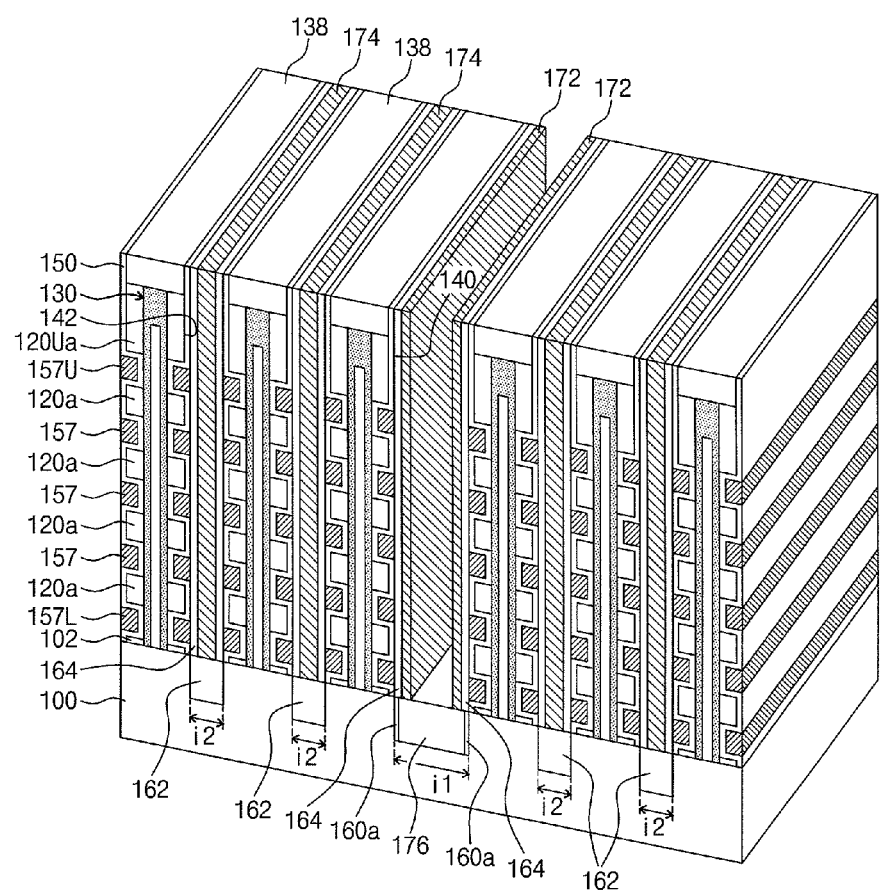

Referring to FIG. 3I, the first conductive layer 170 is anisotropically etched, so that top surfaces of the capping insulation patterns 138 and a portion of a top surface of the dummy doping region 160 are exposed. The first conductive layer 170 remains in the second trenches 142, thereby forming source contact patterns 174. The source contact pattern 174 completely covers the top surface of the common source region 162. Portions of the first conductive layer 170 remaining in the first trench 140 form auxiliary contact portions 172. The auxiliary contact portions 172 are formed on sides of the spacers 164 in the first trench 140. An empty inner space between the auxiliary contact portions 172 is defined in the first trench 140. The source contact pattern 174 extends in the first direction in the first trench 140, and the auxiliary contact portions 172 extend in the first direction in the second trenches 142. The source contact pattern 174 and the auxiliary contact portions 172 have a flat plate shape perpendicularly intersecting the top surface of the substrate 100.

Using the stacked structures, the spacers 164, the source contact patterns 174, and the auxiliary contact portions 172 as a mask, a first conductive type dopant is provided in the substrate 100. As a consequence, the second conductive type dummy doping region 160 is counter-doped with the first conductive type so that a pick-up region 176 is formed. The pick-up region 176 has the same conductive type as the substrate 100 and thus is electrically connected to the substrate 100. A concentration of the first conductive type dopant in the pick-up region 176 is higher than a concentration of the first conductive type dopant in the substrate 100. The pick-up region 176 extends in the first direction in the substrate 100 between the first stacked structure and the second stacked structure.

Using the stacked structures, the spacers 164, and the source contact patterns 174 as a mask, a first conductive type pick-up region 176 is formed. Thereby, a process for forming a mask to obtain the pick-up regions 176 is omitted and accordingly, manufacturing processes of a semiconductor device may be simplified.

The common source region 162 is not doped with the first conductive type dopant due to the spacers 164 and the source contact pattern 174. Part of the dummy doping region 160, which is not counter-doped with the first conductive type dopant, forms the remaining doping regions 160a. The remaining doping regions 160a do not exist if the first conductive type dopant is sufficiently activated in the pick-up region 176.

During the process for providing the first conductive type dopant to form the pick-up region 176, the first conductive type dopant is provided to upper portions of the auxiliary contact portions 172 and the source contact patterns 174.

Figure 3J:
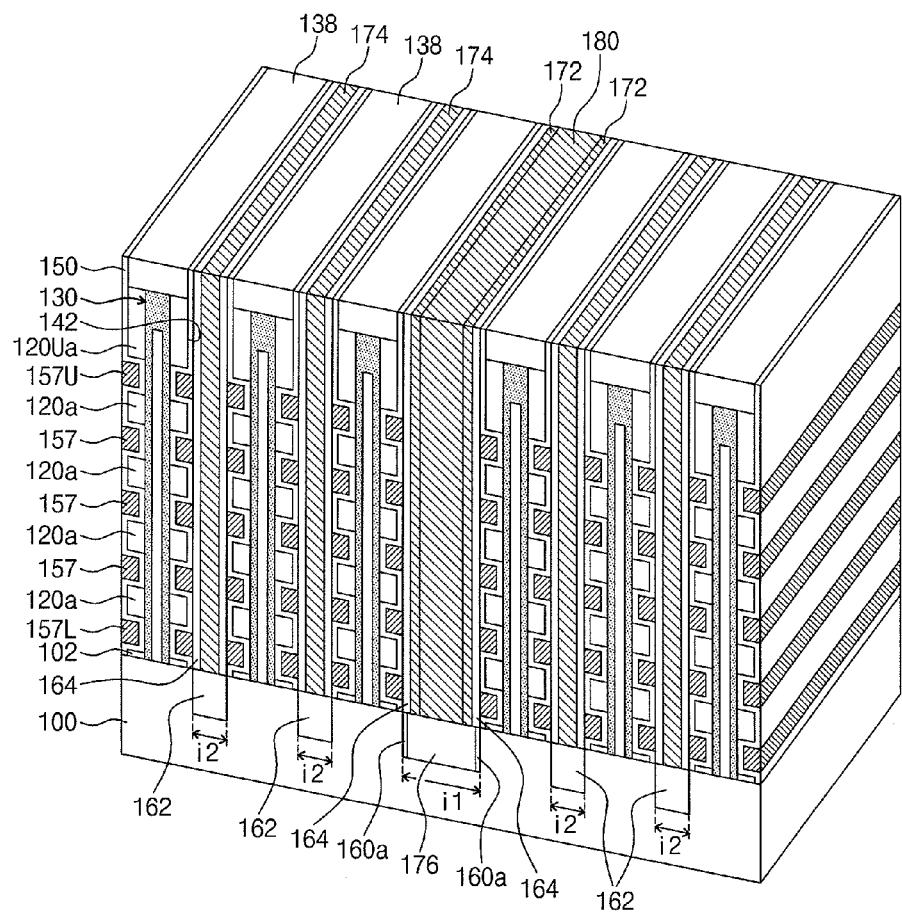

Referring to FIG. 3J, a main contact portion 180 fills a space between the auxiliary contact portions 172 in the first trench 140. The main contact portion 180 contacts the pick-up region 176. The main contact portion 180 is formed by forming a second conductive layer on the substrate 100 having the pick-up region 176 and then planarizing the second conductive layer using the top surface of the capping insulation pattern 138 as an etch stop layer. The main contact portion 180 extends in the first direction in the first trench 140. The main contact portion 180 has a flat plate shape perpendicularly intersecting the top surface of the substrate 100. As a result, pick-up contact patterns 172 and 180 including the main contact portion 180 and the auxiliary contact portions 172 are formed. The second conductive layer includes the same material as the first conductive layer 170 described with reference to FIG. 3H.

If the first conductive type dopant is sufficiently activated in the pick-up region 176, the remaining doping regions 160a do not contact the pick-up contact patterns 172 and 180. According to an embodiment, the remaining doping regions 160a may contact the pick-up contact patterns 172 and 180.

The pick-up contact patterns 172 and 180 and the source contact patterns 174 contacting the pick-up region 176 and the common source regions 162, respectively, are formed by filling the first and second trenches 140 and 142. As a consequence, a process for forming contact holes exposing the pick-up region 176 and the common source regions 162 is omitted. Accordingly, a misalignment occurring during a process for forming the contact holes may be minimized and a void defect in plugs filling the contact holes of a high aspect ratio may be prevented so that reliability may be improved.

Referring back to FIG. 1A, a first conductive line 182 and second conductive lines 184 connected to the pick-up contact patterns 172 and 180 and the source contact patterns 174, respectively, are formed. An interlayer insulation layer 186 is formed on the first and second conductive lines 182 and 184. Bit line contact holes penetrating the interlayer insulation layer 186 and the capping insulation patterns 138 to expose the capping semiconductor patterns 136 are formed. Bit line contact plugs 188 are formed in the bit line contact holes, and bit lines 190 connecting the bit line contact plugs 188 are formed. Accordingly, the semiconductor device according to the embodiment of the inventive concept described with reference to FIGS. 1A and 1B may be provided.

Figure 4:
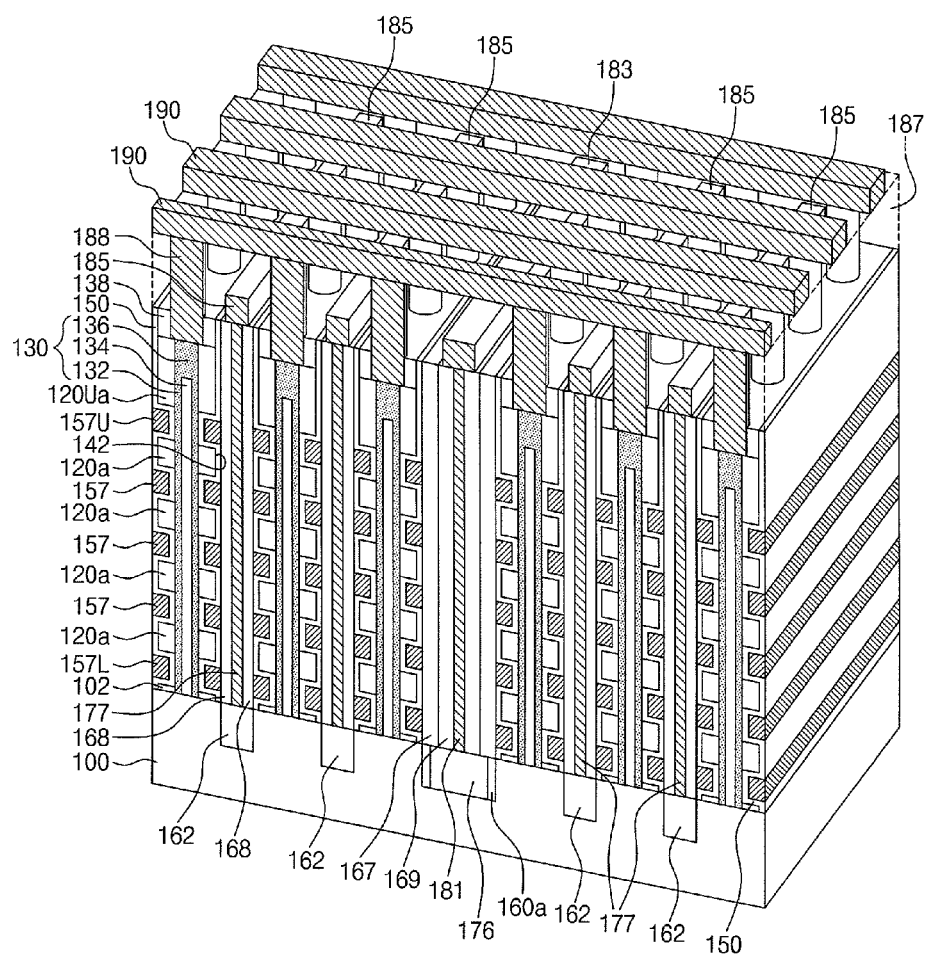
FIG. 4 is a perspective view illustrating a semiconductor device according to an embodiment of the inventive concept.

A semiconductor device according to an embodiment of the inventive concept will be described. FIG. 4 is a perspective view illustrating a semiconductor device according to an embodiment of the inventive concept.

Referring to FIG. 4, the stacked structures described with reference to FIGS. 1A and 1B are disposed on a substrate 100 that is the same as the substrate 100 of FIGS. 1A and 1B.

The stacked structures include first, second, and third stacked structures. The first and second stacked structures are spaced apart from each other at a first interval i1. The third stacked structure is adjacent to the second stacked structure. The third stacked structure and the second stacked structure are spaced apart from each other at a second interval i2. The second interval i2 is narrower than the first interval i1.

A pick-up region 176 extending in a first direction is disposed in the substrate 100 between the first and second stacked structures. Remaining doping regions 160a extend in the first direction in the substrate 100 between the first and second stacked structures and are disposed at two sides of the pick-up region 176. The first direction is parallel to a top surface of the substrate 100. Each of the stacked structures extends in the first direction. The pick-up region 176 and the remaining doping regions 160a are the same as the pick-up region 176 and the remaining doping regions 160a described with reference to FIGS. 1A and 1B.

A common source region 162 extending in the first direction is disposed in the substrate 100 between the second and third stacked structures. The common source region 162 is the same as the common source region 162 described with reference to FIGS. 1A and 1B.

Spacers 167 are disposed between the first stacked structure and the second layer structure. The spacers 167 are respectively formed on a side of the first stacked structure and a side of the second stacked structure which face each other. A gap fill insulation layer 169 is disposed between the spacers 167. A pick-up contact pattern 181 penetrating the gap fill insulation layer 169 to connect to the pick-up region 176 is disposed between the first and second stacked structures. According to an embodiment, the pick-up contact pattern 181 may also penetrate the gap fill insulation layer 169 and the spacers 167. A top surface of the pick-up contact pattern 181 is coplanar with a top surface of the capping insulation pattern 138 on the uppermost insulation pattern 120a. According to an embodiment, the pick-up contact pattern 181 has a flat plate shape intersecting a top surface of the substrate 100 and extending in the first direction. According to an embodiment, the pick-up contact pattern 181 is a pillar shape vertical to a top surface of the substrate 100. The pick-up contact pattern 181 is spaced apart from the gate electrodes 157L, 157, and 157U in the first and second stacked structures by the gap fill insulation layer 169 and the spacers 167.

An insulation structure 168 is disposed between the second stacked structure and the third stacked structure. A source contact pattern 177 penetrating the insulation structure 168 to connect to the common source region 162 is disposed. A top surface of the source contact pattern 177 is coplanar with a top surface of the capping insulation pattern 138. According to an embodiment, the source contact pattern 177 may have a flat plate shape intersecting a top surface of the substrate 100 and extending in the first direction. According to an embodiment, the source contact pattern 177 may have a pillar shape vertical to a top surface of the substrate 100. The source contact pattern 177 is spaced apart from the gate electrodes 157L, 157, and 157U in the second and third stacked structures by the insulation structure 168.

The pick-up contact pattern 181 and the source contact patterns 177 are formed of the same material as the pick-up contact patterns 172 and 180 described with reference to FIGS. 1A and 1B.

The plurality of semiconductor pillars 130 described with reference to FIGS. 1A and 1B are provided. Each of the semiconductor pillars 130 penetrates the alternately and repeatedly stacked gate electrodes 157L, 157, and 157U and insulation patterns 120a and 120Ua and extends in a third direction vertical to a top surface of the substrate 100. The information storage layer 150 described with reference to FIGS. 1A, 1B, and 2 is interposed between the semiconductor pillar 130 and the gate electrodes 157L, 157, and 157U.

A first conductive line 183 is electrically connected to the pick-up contact pattern 181. The first conductive line 183 is disposed on the pick-up contact pattern 181 and extends in the first direction. Second conductive lines 185 are electrically connected to the respective source contact patterns 177. The second conductive line 185 is disposed on the source contact pattern 177 and extends in the first direction.

Bit lines 190 are electrically connected to respective capping semiconductor patterns 136. The bit line 190 is electrically connected to the capping semiconductor pattern 136 through a bit line contact plug 188 penetrating the interlayer insulation layer 187 on the uppermost insulation pattern 120Ua. According to an embodiment, the bit line 190 is the bit line 190 of FIGS. 1A and 1B.

Figure 5A:
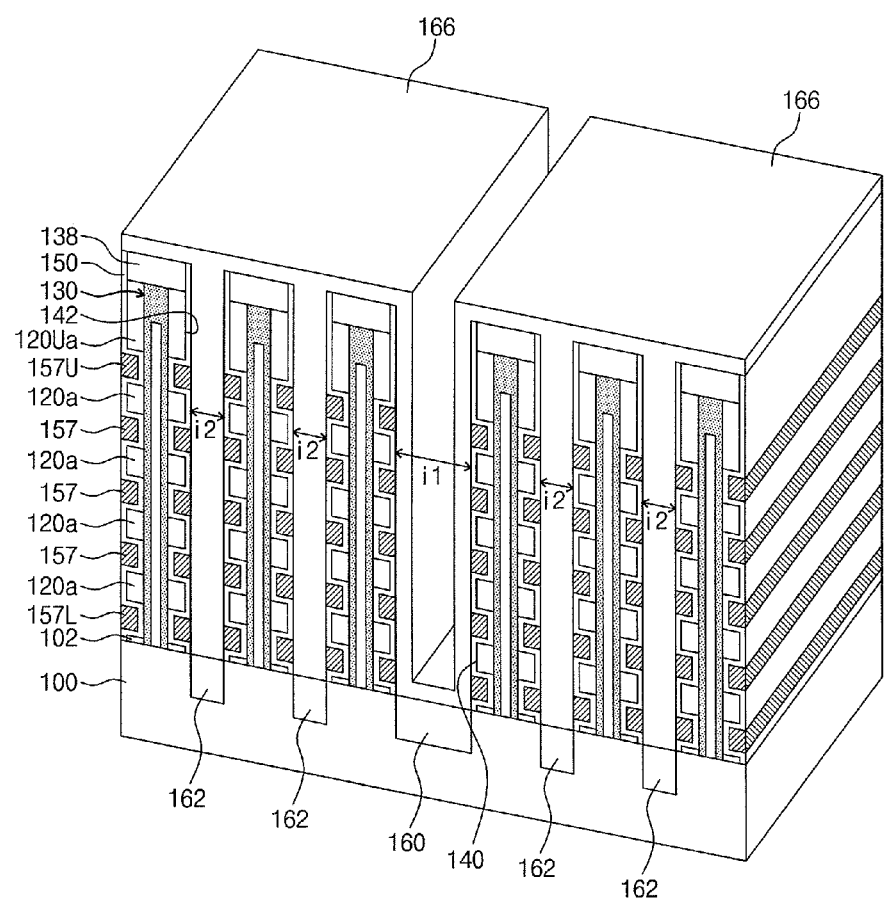
FIGS. 5A through 5B are perspective views illustrating a method of fabricating a semiconductor device according to an embodiment of the inventive concept.
Figure 5B:
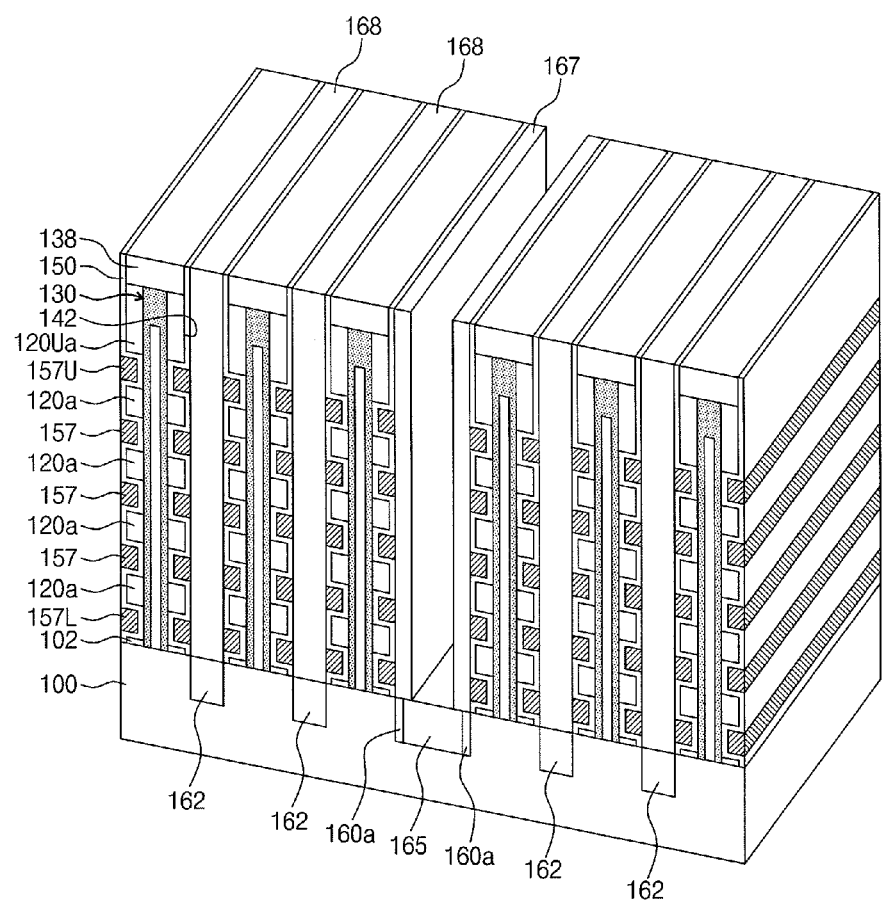

A method of fabricating a semiconductor device according to an embodiment of the inventive concept will be described. FIGS. 5A through 5B are perspective views illustrating a method of fabricating a semiconductor device according to an embodiment of the inventive concept.

Referring to FIG. 5A, a method of fabricating the semiconductor device described with reference to FIGS. 3A and 3B is provided. After common source regions 162 and a dummy doping region 160 are formed, a material layer is formed on a substrate 100.

The material layer is a spacer layer 166. A thickness of the spacer layer 166 is less than a half of a first interval i1 and thicker than a half of a second interval i2. The spacer layer 164 covers side portions and a lower portion of a first trench 140 between the first and second stacked structures and completely fills a second trench 142 between the second and third stacked structures. The spacer layer 166 defines an empty inner space surrounded by the spacer layer 164 in the first trench 140.

Referring to FIG. 5B, the spacer layer 164 is anisotropically etched so that top surfaces of capping insulation patterns 138 are exposed and a portion of a top surface of the dummy doping region 160 constituting the lower portion of the first trench 140. A portion of the etched spacer layer 166 remaining in the first trench 140 forms spacers 167. The spacers 167 cover a side of the first stacked structure and a side of the second stacked structure which face each other. The etched spacer layer 166 remaining in the second trench 142 forms an insulation structure 168. The insulation structure 168 completely covers the top surface of the common source region 162. The spacers 167 and the insulation structure 168 extend in the first direction in the first trench 140 and the second trench 142, respectively.

Using the stacked structures, the spacers 167, and the insulation structures 168 as a mask, a first conductive type dopant is provided in the substrate 100. As a consequence, the second conductive type dummy doping region 160 is counter-doped with the first conductive type dopant so that a pick-up region 165 is formed. The pick-up region 165 has the same conductive type as the substrate 100 and is electrically connected to the substrate 100. A concentration of the first conductive type dopant in the pick-up region 165 is higher than a concentration of the first conductive type dopant in the substrate 100. The pick-up region 165 extends in the first direction in the substrate 100 between the first stacked structure and the second stacked structure.

The common source region 162 is not doped with the first conductive type dopant due to the insulation structure 168. The remaining dummy doping region 160, which is not counter-doped with the first conductive type dopant, forms remaining doping regions 160a. The remaining doping regions 160a do not exist if the first conductive type dopant is sufficiently activated in the pick-up region 165.

Referring back to FIG. 4, a gap fill insulation layer 169 filling a space between the spacers 167 in the first trench 140 is formed. Contact openings penetrating the gap fill insulation layer 169 and the insulation structures 168 to expose the pick-up region 165 and the common source regions 162 are formed, and a pick-up contact pattern 181 and source contact patterns 177 are formed by filling the contact openings.

A first conductive line 183 and second conductive lines 185 connecting to the pick-up contact pattern 181 and the source contact patterns 177, respectively, are formed. An interlayer insulation layer 187 is formed on the first and second conductive lines 183 and 185. Bit line contact holes penetrating the interlayer insulation layer 187 and the capping insulation pattern 138 to expose the capping semiconductor pattern 136 are formed. Bit line contact plugs 188 are formed in the bit line contact holes and bit lines 190 connecting the bit line contact plugs 188 are formed. As a result, the semiconductor device described with reference to FIG. 4 may be provided.

Figure 6:
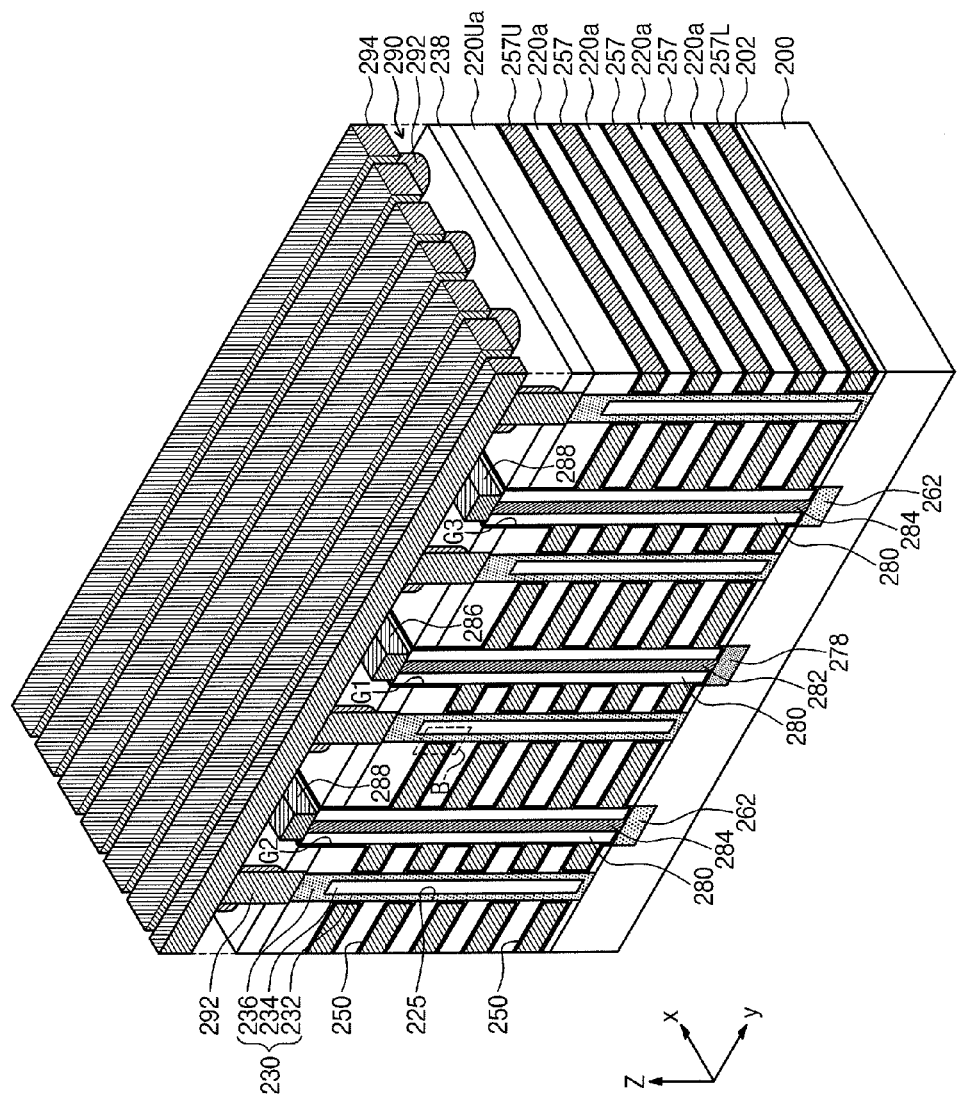
FIG. 6 is a perspective view illustrating a semiconductor device according to an embodiment of the inventive concept.

A method of fabricating a semiconductor device according to an embodiment of the inventive concept will be described. FIG. 6 is a perspective view illustrating a semiconductor device according to an embodiment of the inventive concept.

Referring to FIG. 6, first and second patterns are alternately and repeatedly stacked on a substrate 200. The first patterns are gate electrodes 257L, 257, and 257U. The second patterns are insulation patterns 220a and 220Ua. The substrate 200 is a semiconductor substrate. The substrate 200 is doped with a first conductive type dopant.

The alternately stacked gate electrodes 257L, 257, and 257U and insulation patterns 220a and 220Ua constitute a stacked structure. A plurality of stacked structures are disposed on the substrate 200. The plurality of stacked structures are arranged side by side and extend in a first direction. The first direction is parallel to a top surface of the substrate 200. The first direction is an x-axial direction in the drawings. The gate electrodes 257L, 257, and 257U and insulation patterns 220a and 220Ua are arranged side by side and extend in the first direction.

The plurality of stacked structures are spaced apart from each other in a second direction with the substantially same interval. The second direction is parallel to a top surface of the substrate 200 and is perpendicular to the first direction. The second direction is along a y-axis in the drawings. Gap regions G1, G2, and G3 between respective adjacent stacked structures are defined. Widths of the gap regions G1, G2, and G3 are the same in the second direction.

The insulation patterns 220a and 220Ua include an oxide. For example, the insulation patterns 220a and 220Ua include a silicon oxide. The gate electrodes 257L, 257 and 257U include a conductive material. For example, the gate electrodes 257L, 257 and 257U include at least one of metals (e.g., tungsten, aluminum, titanium, tantalum, etc.), conductive metal nitrides (e.g., nitride titanium, nitride tantalum, etc.), and doped semiconductor materials (e.g., doped silicon, doped germanium, doped silicon germanium, etc.).

A pick-up region 278 is disposed in the substrate 200 under the first gap region G1. The pick-up region 278 extends in the first direction in the substrate 10. The pick-up region 278 is doped with a first conductive type dopant. A concentration of a first conductive type dopant in the pick-up region 278 is higher than in the substrate 200. The pick-up region 278 has the same first conductive type as the substrate 200, and the pick-up region 278 and the substrate 200 are electrically connected to each other. According to an embodiment of the inventive concept, a voltage is stably supplied to the substrate 200 through the pick-up region 278. The pick-up region 278 is a region in the substrate 200, which is doped with a second conductive type and counter-doped with the first conductive type dopant.

Common source regions 262 are disposed in the substrate 200 under the second and third gap regions G2 and G3. The common source regions 262 extend in the substrate 200 in the first direction. The common source regions 262 are counter-doped with the second conductive type dopant in the first conductive type substrate 200. In the second direction, widths of the common source regions 262 are the same as a width of the pick-up region 278.

Gap fill insulation patterns 280 fill the gap regions G1, G2, and G3. The gap fill insulation patterns 280 are formed of a silicon oxide layer and/or a silicon nitride layer.

Contact patterns 282 and 284 are disposed in the gap regions G1, G2, and G3. A pick-up contact pattern 282 penetrates the gap fill insulation pattern 280 in the first gap region G1 to contact the pick-up region 278. Common source contact patterns 284 penetrate the gap fill insulation patterns 280 in the second and third gap regions G2 and G3 to contact the common source regions 262. The contact patterns 282 and 284 are formed of the same material by the same process. In the second direction, widths of the contact patterns 282 and 284 are the same. Top surfaces of the pick-up contact pattern 282 and the common source contact pattern 284 are coplanar with a top surface of the capping insulation pattern 238 on the uppermost insulation pattern 220Ua.

According to an embodiment, the contact patterns 282 and 284 extend in the first direction in the regions G1, G2, and G3, and have a flat plate shape vertical to a top surface of the substrate 200. According to an embodiment, the contact patterns 282 and 284 have a pillar shape vertical to a top surface of the substrate 200.

The contact patterns 282 and 284 include a conductive material. For example, the contact patterns 282 and 284 include at least one of metals (e.g., tungsten, aluminum, titanium, tantalum, etc.), conductive metal nitrides (e.g., nitride titanium, nitride tantalum, etc.), and doped semiconductor materials (e.g., doped silicon, doped germanium, doped silicon germanium, etc.).

A plurality of semiconductor pillars 230 penetrate the alternately and repeatedly stacked gate electrodes 257L, 257 and 257U and insulation patterns 220a and 220Ua. The semiconductor pillars 230 extend in a third direction vertical to the first and second directions. The third direction is vertical to a top surface of the substrate 200. The third direction is a z-axial direction in the drawings. The semiconductor pillars 230 are provided on the substrate 200. The plurality of semiconductor pillars 230 are two-dimensionally arranged along the first direction and the second direction. The plurality of semiconductor pillars 230 penetrate each of the stacked structures.

Each of the semiconductor pillars 230 includes a vertical-type semiconductor pattern 232, a filling dielectric pattern 234, and a capping semiconductor pattern 236. The vertical-type semiconductor pattern 232 covers a sidewall of the channel opening 225 penetrating the alternately and repeatedly stacked gate electrodes 257L, 257, and 257U and insulation patterns 220a and 220Ua. The filling dielectric pattern 234 fills an inner space surrounded by the vertical-type semiconductor pattern 232 in the channel opening 225. The capping semiconductor pattern 236 fills an upper region of the channel opening 225. According to an embodiment, each of the semiconductor pillars 230 is formed of a semiconductor material that completely fills the channel opening 225.

Each of the semiconductor pillars 230, the gate electrodes 257L, 257, and 257U surrounding the semiconductor pillars 230, and an information storage layer 250 interposed between each of the semiconductor pillars 230 and the gate electrodes 257L, 257, and 257U are included in a vertical-type cell string. The vertical-type cell string includes a lower selection transistor, a plurality of memory cells, and an upper selection transistor, which are connected in series to each other and are stacked. Among the gate electrodes 257L, 257, and 257U, a lowermost gate electrode 257L corresponds to a gate of the lower selection transistor, and an uppermost gate electrode 257L corresponds to a gate of the upper selection transistor. Gate electrodes 257 between the lowermost and uppermost gate electrodes 257L and 257U correspond to gates of the memory cells, respectively.

Figure 7:
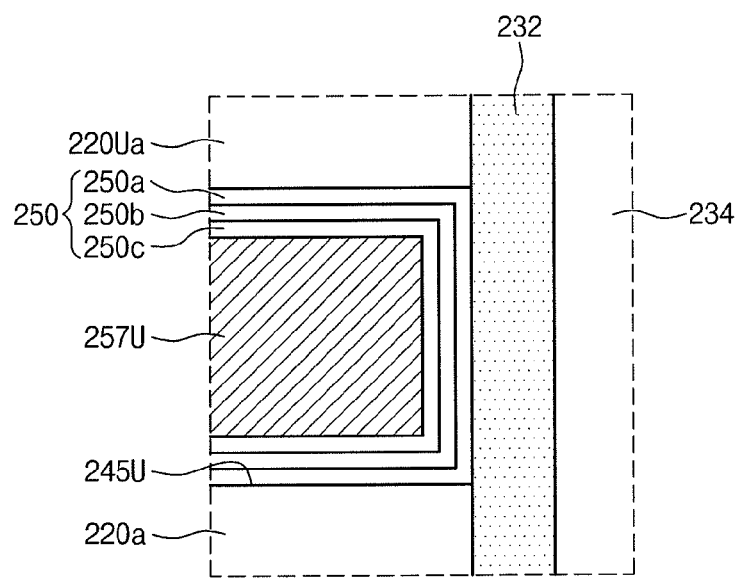
FIG. 7 is an enlarged view of 'B' of FIG. 6 illustrating an information storage layer in a semiconductor device according to an embodiment of the inventive concept.

The information storage layer 250 is formed of a multilayered dielectric layer. The information storage layer 250 will be described with reference to FIG. 7. FIG. 7 is an enlarged view of 'B' of FIG. 6 illustrating an information storage layer in a semiconductor device according to an embodiment of the inventive concept.

The information storage layer 250 is obtained by sequentially forming a tunnel dielectric layer 250a, a charge storage layer 250b, and a blocking layer 250c. The tunnel dielectric layer 250a covers a sidewall of the semiconductor pillar 230. The charge storage layer 250b covers the tunnel dielectric layer 250a. The tunnel dielectric layer 250a is interposed between the charge storage layer 250b and the semiconductor pillar 230. The blocking layer 250c covers the charge storage layer 250b. The charge storage layer 250b is disposed between the blocking layer 250c and the tunnel dielectric layer 250a. The tunnel dielectric layer 250a, the charge storage layer 250b, and the blocking layer 250c include the same material as the tunnel dielectric layer 150a, the charge storage layer 150b, and the blocking layer 150c described with reference to FIG. 2.

An information storage layer 250 between the gate electrode 257 and the semiconductor pillar 230 corresponds to a data storage element of the memory cell. The information storage layer 250 between the lowermost gate electrode 257L and the semiconductor pillar 230 is included in a first gate insulation layer of the lower selection transistor. The buffer dielectric layer 202 and the information storage layer 250 interposed between the lowermost gate electrode 257L and the substrate 200 are included in a second gate insulation layer of the lower selection transistor. The lowermost gate electrode 257L controls an electrical connection between the common source regions 262 and/or the pick-up region 278 and the semiconductor pillar 230. The information storage layer 250 between the uppermost gate electrode 257U and the semiconductor pillar 230 is included in a gate insulation layer of the upper selection transistor.

The lower selection transistor, the memory cells, and the upper selection transistor, respectively, include vertical channel regions defined at a sidewall of the semiconductor pillar 230. The lower selection transistor further includes a parallel channel region defined in the substrate 200 under the lowermost gate electrode 257L.

A buffer dielectric layer 202 is disposed between each of the stacked structures and the substrate 200. The semiconductor pillar 230 extends downwardly to penetrate the buffer dielectric layer 202. As a consequence, the semiconductor pillar 230 contacts the substrate 200. The buffer dielectric layer 202 includes an oxide. The capping dielectric patterns 238 are disposed on the semiconductor pillars 230 penetrating the stacked structures. Two sidewalls of the capping dielectric pattern 238 are respectively aligned with two sidewalls of a stacked structure positioned under the capping dielectric pattern 238. The capping dielectric pattern 238 includes an oxide, a nitride and/or an oxynitride.

A first conductive line 286 is electrically connected to the pick-up contact pattern 282. The first conductive line 286 is disposed on the pick-up contact pattern 282 and extends in the first direction. Second conducive lines 288 are electrically connected to the common source contact patterns 284. The second conductive lines 288 are disposed on the common source contact patterns 284 and extend in the first direction. The first conductive line 286 and the second conductive line 288 are parallel to each other. In the second direction, widths of the first and second conductive lines 286 and 288 are the same.

Bit lines 294 are electrically connected to the capping semiconductor patterns 236. The uppermost gate electrodes 257U control an electrical connection between the bit lines 294 and the vertical-type cell strings. The bit lines 294 extend in the second direction to cross over the gate electrodes 257L, 257, and 257U. The bit lines 294 are disposed on the substrate 200. The bit lines 294 are parallel to each other. A bit line 294 is electrically connected to each of the capping semiconductor patterns 236, which are formed at the respective semiconductor pillars 130 constituting a column arranged in the second direction. The bit lines 294 are electrically connected to the capping semiconductor patterns 236 through bit line contact plugs 292 penetrating the capping insulation patterns 238 and the interlayer insulation layer 290 on the stacked structures.

A method of fabricating a semiconductor device according to an embodiment of the inventive concept will be described.

FIGS. 8A, 9A, 10A, 11A, 12A, 13A, 14A, 15A, 16A, 17A, and 18A are plan views illustrating a method of fabricating a semiconductor device according to an embodiment of the inventive concept. FIGS. 8B, 9B, 10B, 11B, 12B, 13B, 14B, 15B, 16B, 17B, and 18B are sectional views taken along the lines A-A' of FIGS. 8A, 9A, 10A, 11A, 12A, 13A, 14A, 15A, 16A, 17A, and 18A, respectively.

Figure 8A:
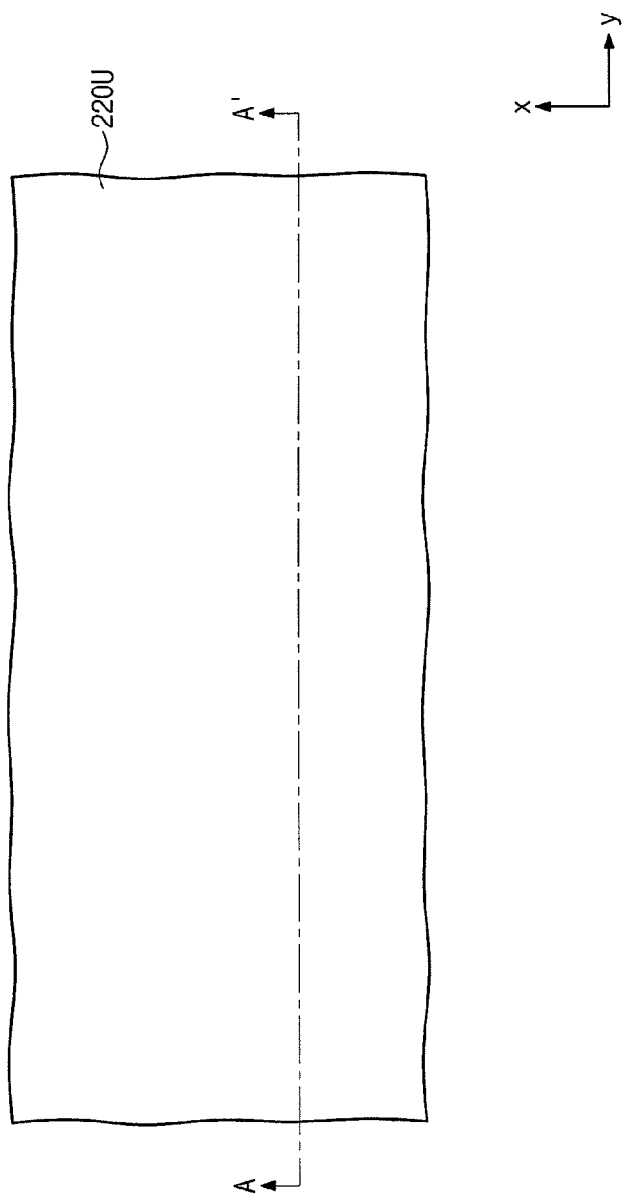
Figure 8B:
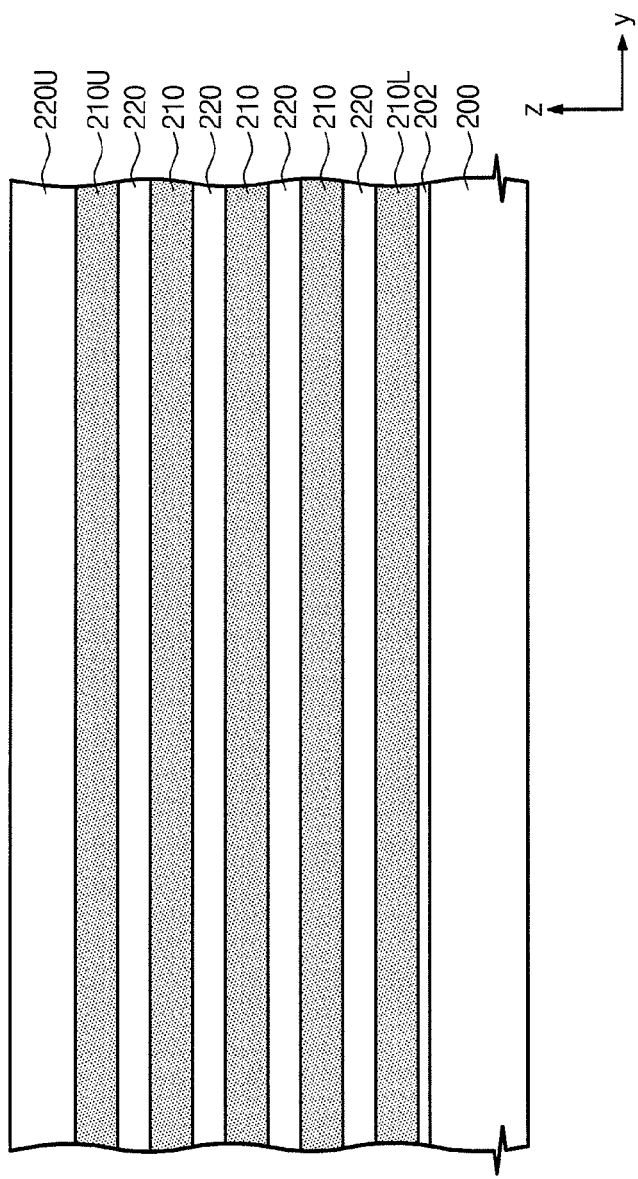
FIGS. 8B, 9B, 10B, 11B, 12B, 13B, 14B, 15B, 16B, 17B, and 18B are sectional views taken along the lines A-A' of FIGS. 8A, 9A, 10A, 11A, 12A, 13A, 14A, 15A, 16A, 17A, and 18A, respectively.

Referring to FIGS. 8A and 8B, sacrificial layers 210L, 210, and 210U and insulation layer 220 and 220U are alternately and repeatedly stacked on the substrate 200. The substrate 200 is a semiconductor substrate.

The sacrificial layers 210L, 210, and 210U are formed of a material having a predetermined etch selectivity with respect to the insulation layers 220 and 220U. For example, the insulation layers 220 and 220U are formed of an oxide, and the sacrificial layers 210L, 210, and 210U are formed of a nitride and/or an oxynitride. The sacrificial layers 210L, 210, and 210U are formed of the same material. In the same manner, the insulation layers 220 and 220U are formed of the same material.

The sacrificial layers 210L, 210, and 210U are formed with the same thickness. According to an embodiment, among the sacrificial layers 210L, 210, and 210U, a lowermost sacrificial layer 210L and an uppermost sacrificial layer 210U are formed thicker than the sacrificial layers 210 between the lowermost sacrificial layer 210L and the uppermost sacrificial layer 210U. According to an embodiment, the sacrificial layers 210 between the lowermost sacrificial layer 210L and the uppermost sacrificial layer 210U are formed with the same thickness. An uppermost insulation layer 220U among the insulation layers 220 and 220U is formed thicker than the insulation layers 220 positioned under the uppermost insulation layer 220U. According to an embodiment, the insulation layers 220 and the uppermost insulation layer 220U are formed with the same thickness.

Before the forming of the sacrificial layers 210L, 210, and 210U and the insulation layers 220 and 220U, a buffer dielectric layer 202 is formed on the substrate 200. The sacrificial layers 210L, 210, and 210U and the insulation layers 220 and 220U are formed on the buffer dielectric layer 202. The buffer dielectric layer 202 is formed of a dielectric material having a predetermined etch selectivity with respect to the sacrificial layers 210L, 210, and 210U.

Figure 9A:
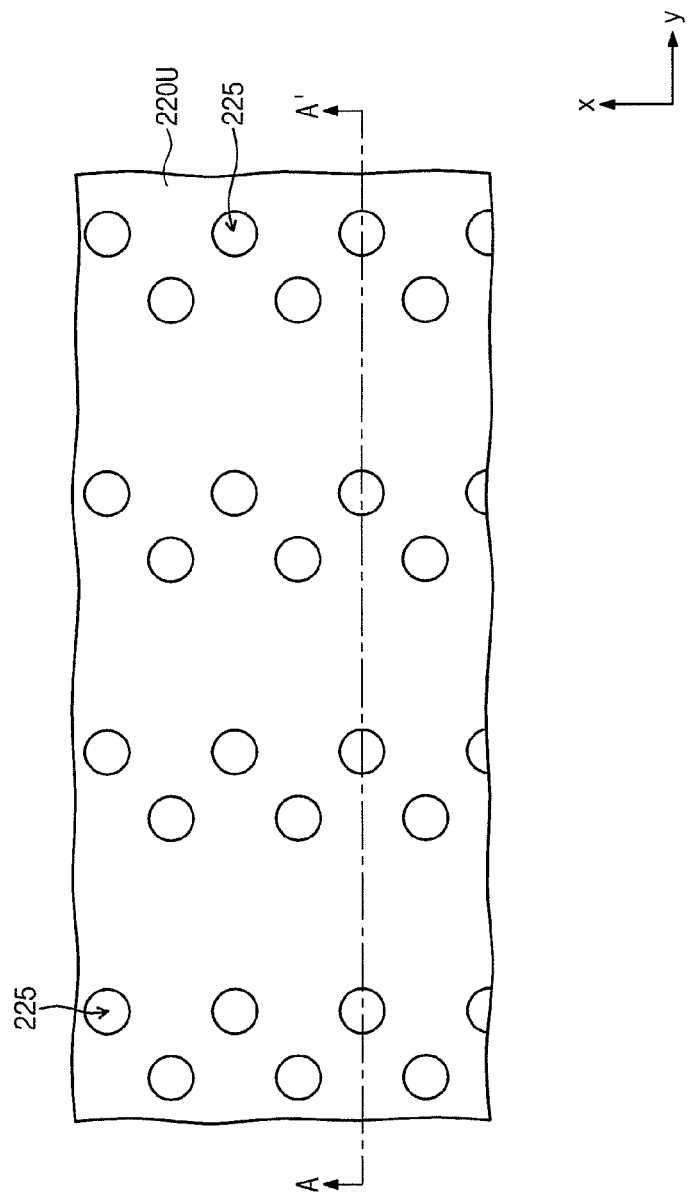
Figure 9B:
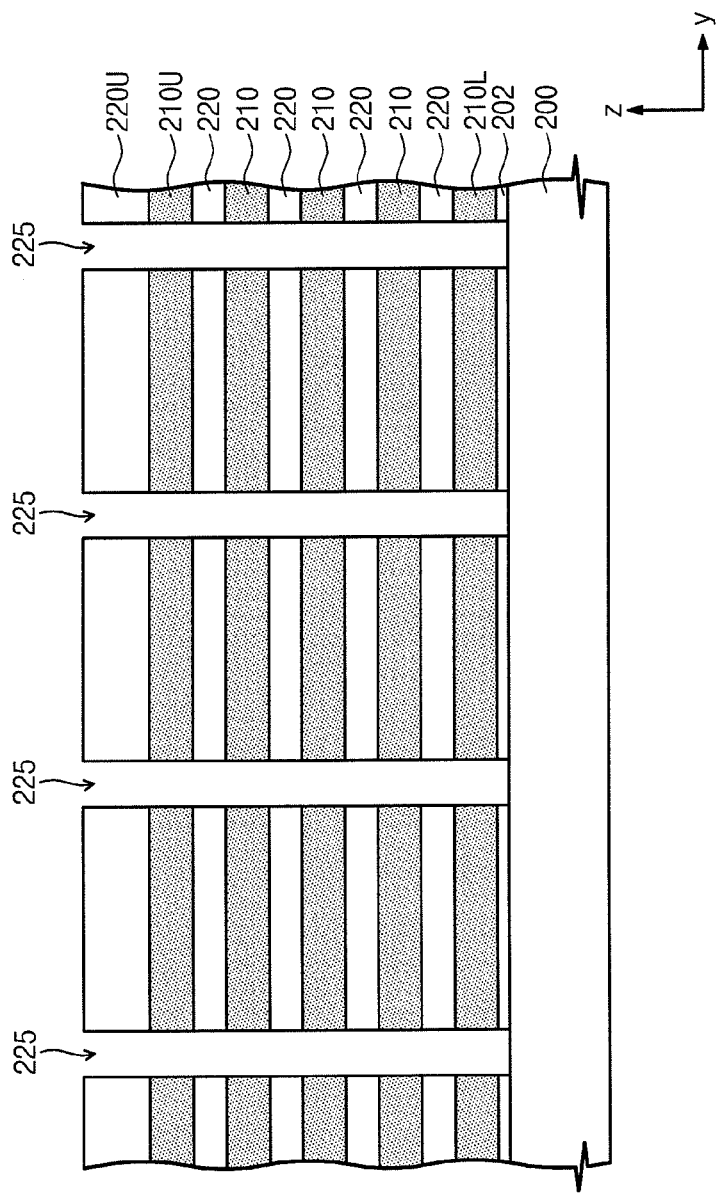

Referring to FIGS. 9A and 9B, channel openings 225 penetrating the insulation layers 220 and 220U, the sacrificial layers 210L, 210, and 210U, and the buffer dielectric layer 102 are formed. A lower portion of the channel opening 225 is a portion of a top surface of the substrate 200. The channel openings 225 are formed using an isotropic etching process.

The channel openings 225 have a hole shape. The channel openings 225 are spaced apart from each other. The channel openings 225 are two-dimensionally arranged along a first direction and a second direction perpendicular to the first direction. The first direction and the second direction are parallel to a top surface of the substrate 200. In the drawings, the first direction is along an x-axis and the second direction is along a y-axis.

Figure 10B:
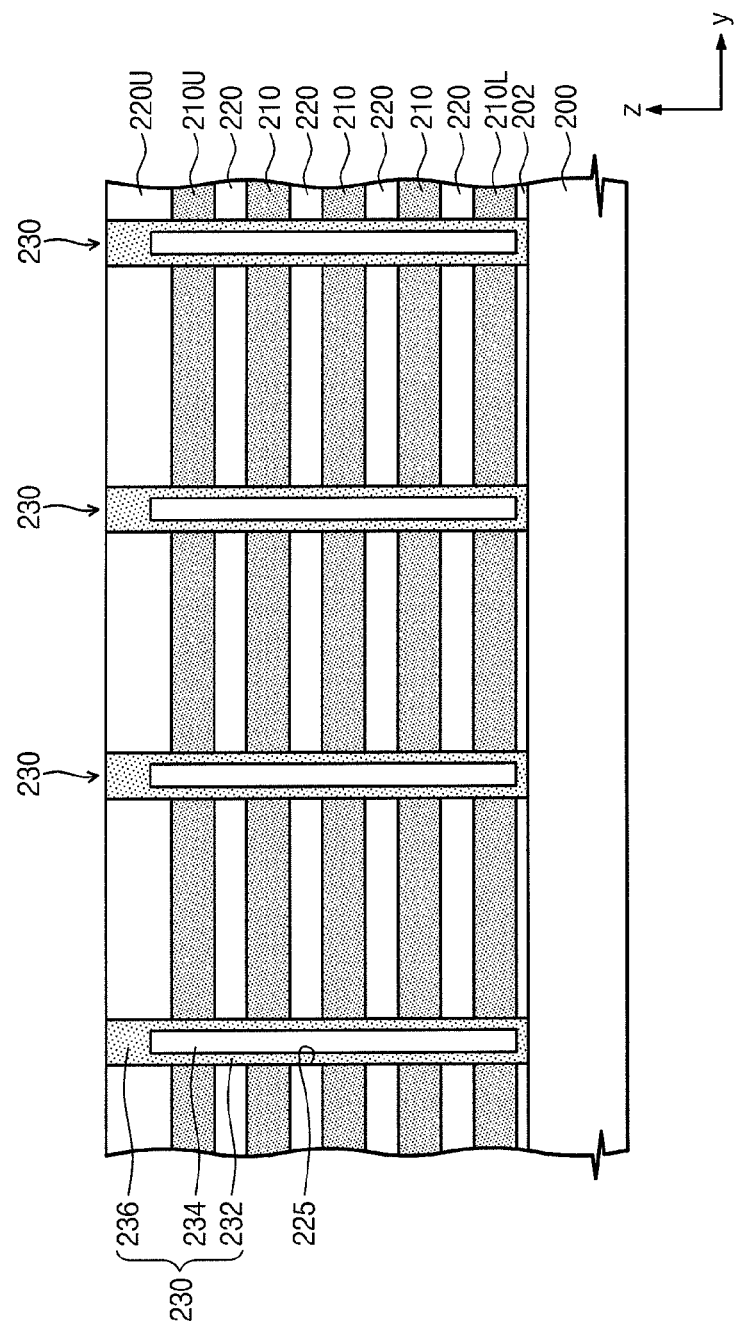

Referring to FIGS. 10A and 10B, semiconductor pillars 230 are formed in the respective channel openings 225. The semiconductor pillar 230 contacts a top surface of the substrate 200, which constitutes a low portion of the channel opening 225. The forming of the semiconductor pillar 230 includes forming a vertical-type semiconductor pattern 232 covering side and lower portions of the channel opening 225, filling with a filling dielectric pattern 234 an inner space surrounded by the vertical-type semiconductor pattern 232 in the channel opening 225, removing a portion of the filling dielectric pattern 232 from an upper region of the channel opening 225, and forming a capping semiconductor pattern 236 filling the upper region of the channel opening 225. According to an embodiment, the entire channel opening 225 is filled with a semiconductor material.

The vertical-type semiconductor pattern 232 and the capping semiconductor pattern 236 include the same semiconductor element as the substrate 200. For example, if the substrate 200 is a silicon substrate, the vertical-type semiconductor pattern 232 and the capping semiconductor pattern 236 include silicon. According to an embodiment, the vertical-type semiconductor pattern 232 is doped with a first conductive type dopant or is undoped. At least a portion of the capping semiconductor pattern 236 is doped with a second conductive type dopant different from the first conductive type dopant.

The vertical-type semiconductor pattern 232 and the capping semiconductor pattern 236 are in a crystalline or amorphous state. If the vertical-type semiconductor pattern 232 and the capping semiconductor pattern 236 are in an amorphous state, a crystallization process is performed on the vertical-type semiconductor pattern 232 and the capping semiconductor pattern 236. For example, the crystallization process includes supplying heat or projecting laser beams to the vertical-type semiconductor pattern 232 and the capping semiconductor pattern 236.

Figure 11A:
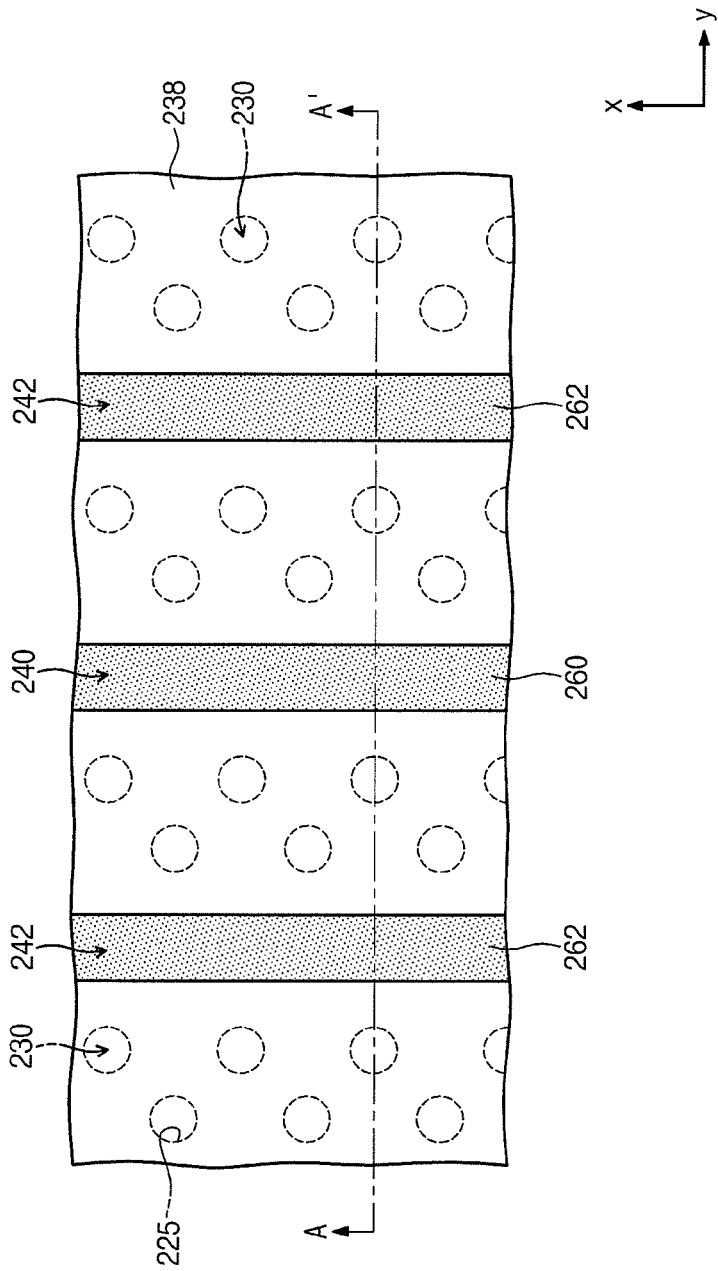
Figure 11B:
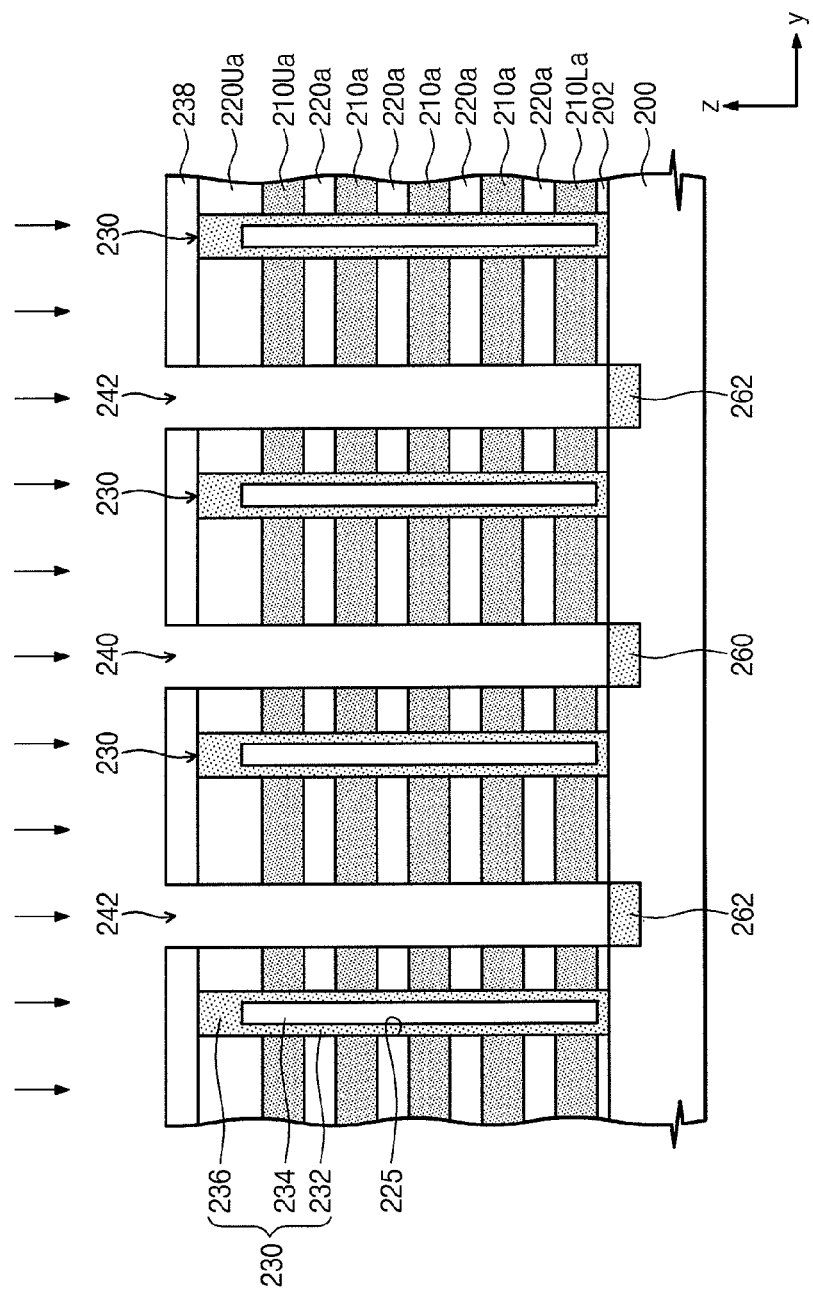

Referring to FIGS. 11A and 11B, a first trench 240 and second trenches 242 are obtained by continuously patterning the insulation layers 220U and 220 and the sacrificial layers 210U, 210, and 210L. In the second direction, widths of the second trenches 242 are the same. According to an embodiment of the inventive concept, widths of the first trench 240 and the second trenches 242 are the same. According to an embodiment, a width of the first trench 240 is broader than widths of the second trenches 242. According to an embodiment, the first trench 240 is disposed between the second trenches 242.

The first and second trenches 240 and 242 define sacrificial patterns 210La, 210a, and 210Ua and insulation patterns 220a and 220Ua, which are alternately and repeatedly stacked. The forming of the first and second trenches 240 and 242 is performed using an anisotropic etching process. The first and second trenches 240 and 242 are arranged side by side and extend in the first direction. The sacrificial patterns 210La, 210a, and 210Ua and the insulation patterns 220a and 220Ua have line shapes arranged side by side and extending in the first direction. The alternately and repeatedly stacked sacrificial patterns 210La, 210a, and 210Ua and insulation patterns 220a and 220Ua are spaced apart from each other in the second direction.

The sacrificial patterns 210La, 210a, and 210Ua and insulation patterns 220a and 220Ua are exposed to sidewalls of the first and second trenches 240 and 242. During the forming of the first and second trenches 240 and 242, the buffer dielectric layer 202 is etched so that the substrate 200 is exposed to the first and second trenches 240 and 242. According to an embodiment, the buffer dielectric layer 202 is exposed to the trenches 240 and 242. Hereinafter, for convenience of description, an embodiment in which lower portions of the first and second trenches 240 and 242 are located on the substrate 200 will be described.

Before the forming of the first and second trenches 240 and 242, a capping insulation layer is formed. The capping insulation layer is patterned together with the insulation patterns 220a and 220Ua and the sacrificial patterns 210U, 210, and 210L, thus forming capping insulation patterns 238 on the alternately and repeatedly stacked sacrificial patterns 210La, 210a, and 210Ua and insulation patterns 220a and 220Ua.

Using the capping insulation patterns 238, the sacrificial patterns 210La, 210a, and 210Ua, and the insulation patterns 220a and 220Ua as an ion implantation mask, the second conductive type dopant is injected into the substrate 200. Accordingly, portions of the substrate 200 that are located under the trenches 240 and 242 are counter-doped with the second conductive type dopant. A preliminary doping region 260 is formed under a lower portion of the first trench 240, and common source regions 262 are formed under lower portions of the second trenches 242. The preliminary doping region 260 and the common source regions 262 extend in the first direction in the substrate 200.

Figure 12A:
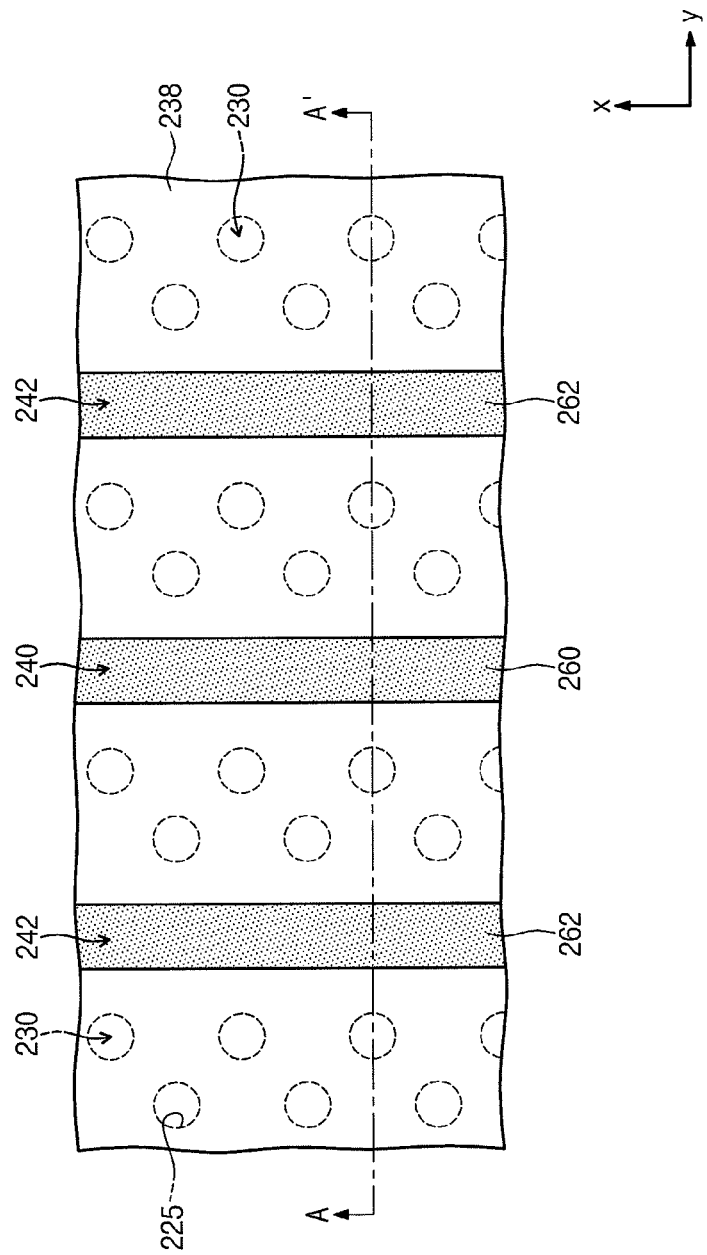
Figure 12B:
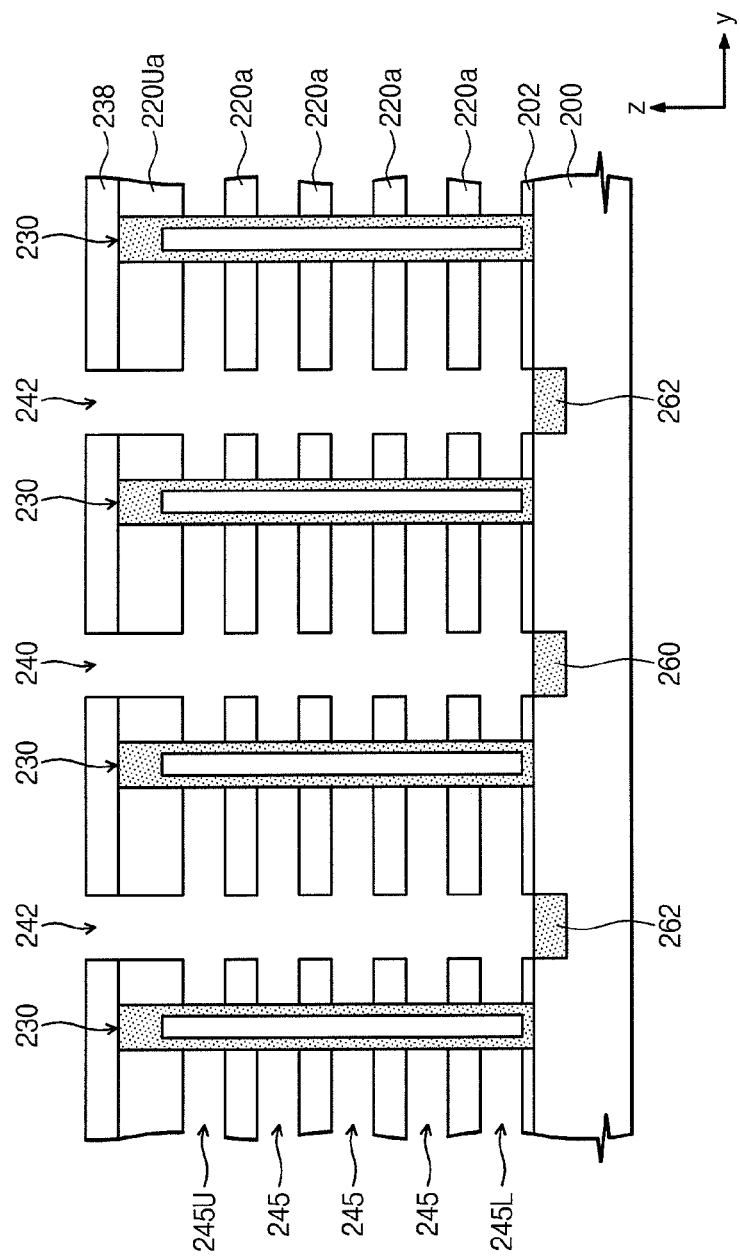

Referring to FIGS. 12A and 12B, recess regions 245L, 245, and 245U are formed by removing the sacrificial patterns 210La, 210a, and 210Ua exposed to the trenches 240 and 242 through a selective etching process. According to an embodiment, the selective etching process is isotropic etching. According to an embodiment, the selective etching process is performed through wet etching and/or isotropic dry etching. An etching rate of the sacrificial patterns 210La, 210a, and 210Ua by the selective etching process is greater than an etching rate of the insulation patterns 220a and 220Ua, the buffer dielectric layer 202, and the semiconductor pillar 230 by the selective etching process. Accordingly, after the selective etching process, the insulation patterns 220a and 220Ua, the buffer dielectric layer 202, and the semiconductor pillars 230 remain. According to an embodiment, the buffer dielectric layer 202 that is thinner in thickness than the insulation patterns 220a and 220Ua is removed by the selective etching process. For convenience of description, an example where the buffer dielectric layer 202 remains will be described.

The recess regions 245L, 245, and 245U respectively expose portions of a sidewall of the semiconductor pillar 230. Among the recess regions 245L, 245, and 245U, a lowermost recess region 245L is formed by removing the lowermost sacrificial pattern 210La, and the uppermost recess region 245U is formed by removing the uppermost sacrificial pattern 210Ua. The recess regions 245 between the lowermost and uppermost recess regions 245L and 245U are formed by removing the sacrificial patterns 210a between the lowermost and uppermost sacrificial patterns 210La and 210Ua. A lower portion of the lowermost recess region 245L includes a portion of the buffer dielectric layer 202.

Figure 13A:
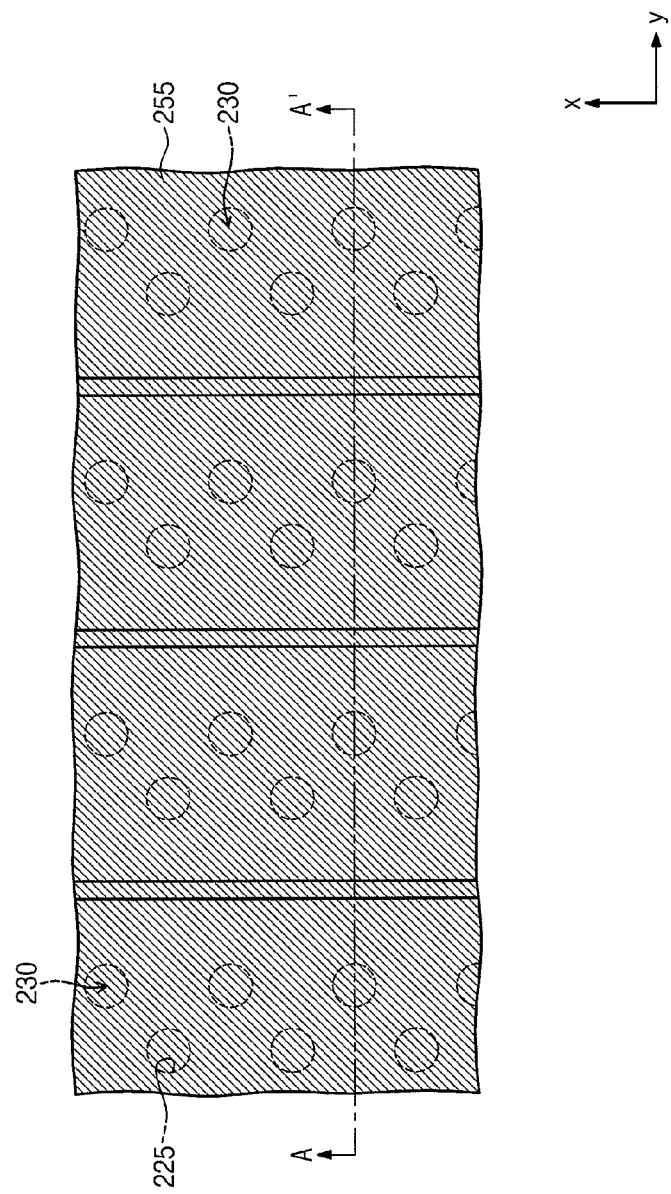
Figure 13B:
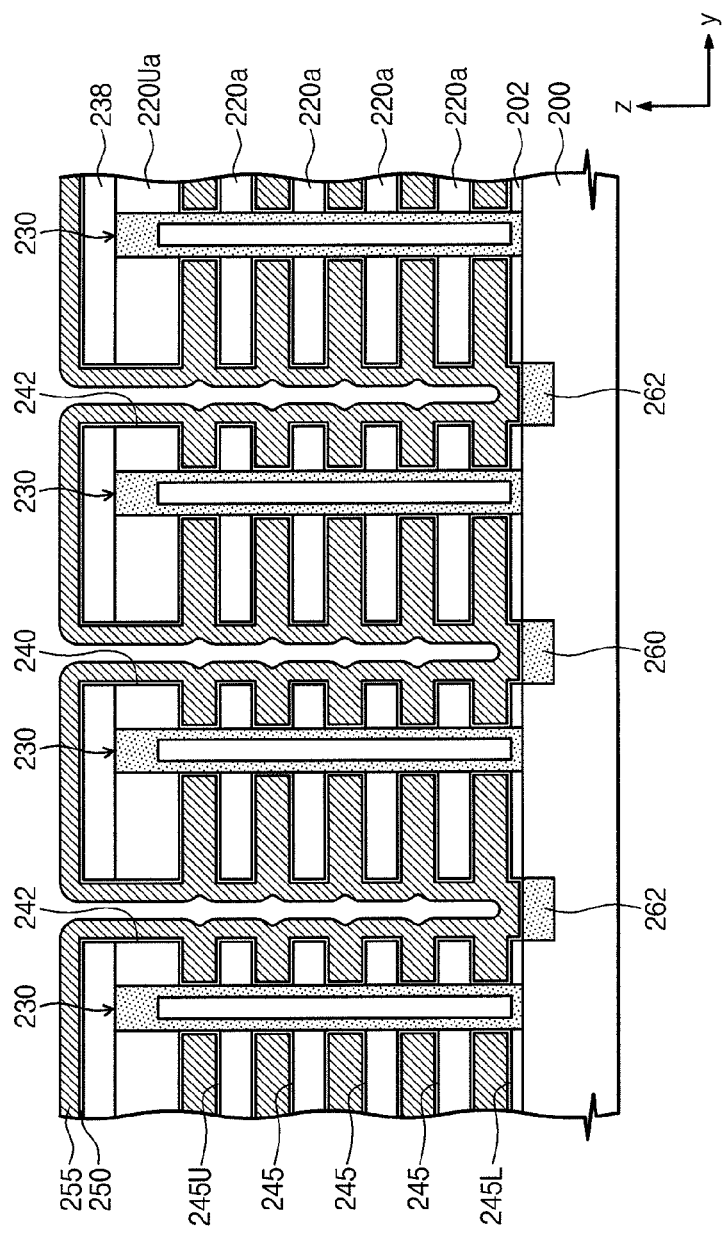

Referring to FIGS. 13A and 13B, after the forming of the recess regions 245L, 245, and 245U, an information storage layer 250 is formed on the substrate 200. The information storage layer 250 is conformally formed using a deposition technique (e.g., a chemical vapor deposition method or an atomic layer deposition layer). The information storage layer 250 is formed with substantially a uniform thickness along the inner surfaces of the recess regions 245L, 245, and 245U. The information storage layer 250 fills portions of the recess regions 245L, 245, and 245U.

The information storage layer 250 is obtained by sequentially forming the tunnel dielectric layer 250a, the charge storage layer 250b, and the blocking layer 250c, as described with reference to FIG. 7.

After the forming of the information storage layer 250, a gate conductive layer 255 is formed on the substrate 200. The gate conductive layer 255 fills the recess regions 245L, 245, and 245U. According to an embodiment, the gate conductive layer 255 fills a portion or entirety of the trenches 240. The gate conductive layer 255 is electrically insulated from the semiconductor pillars 230 and the substrate 200 by the information storage layer 250. The gate conductive layer 255 is formed through a chemical vapor deposition method, a physical vapor deposition method, or an atomic layer chemical deposition layer. The gate conductive layer 255 includes at least one of metals, a metal silicide, a conductive metal nitride, and doped semiconductor materials.

Figure 14A:
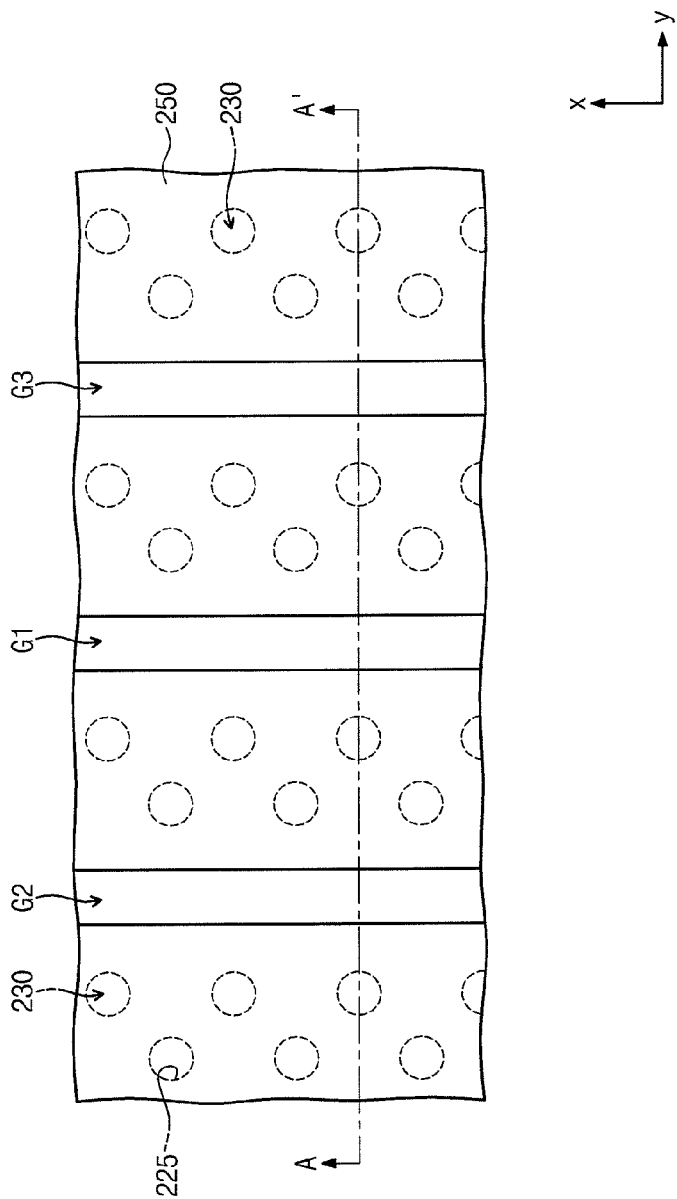
Figure 14B:
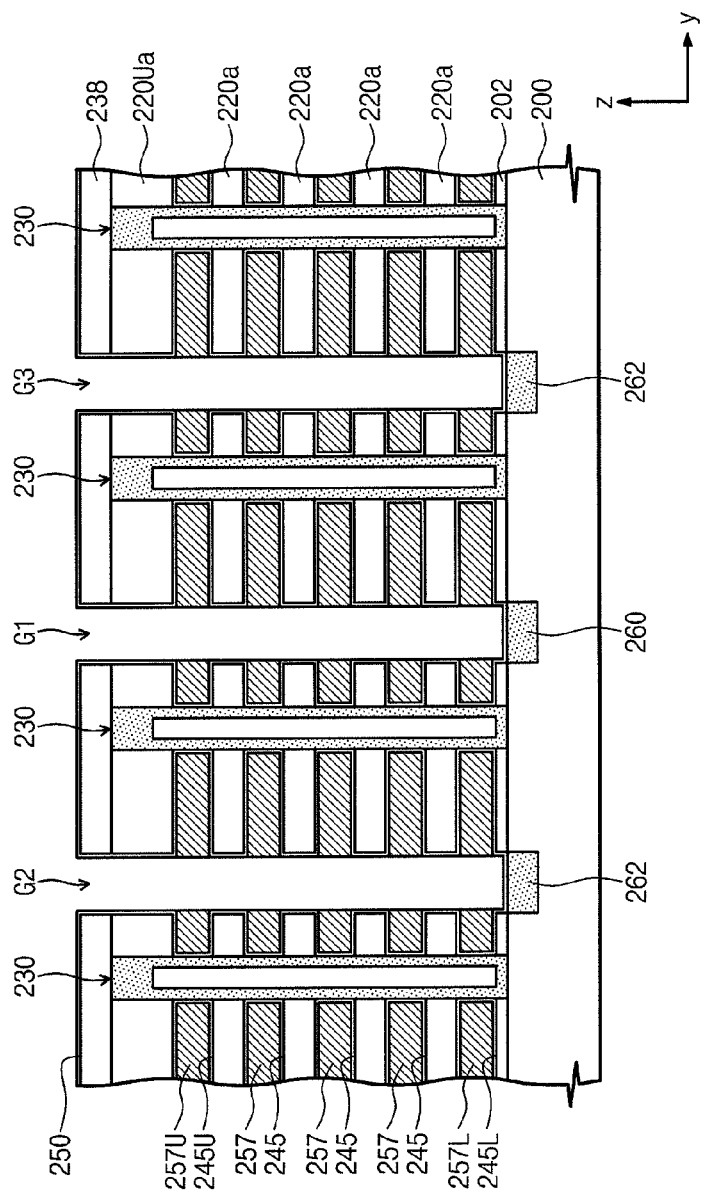

Referring to FIGS. 14A and 14B, after the forming of the gate conductive layer 255, gate electrodes 257L, 257, and 257U are formed in the recess regions 245L, 245, and 245U by removing the gate conductive layer 255 from an area outside of the recess regions 245L, 245, and 245U by, for example, a wet etching and/or dry etching process.

The gate electrodes 257L, 257, and 257U respectively correspond to portions of the gate conductive layers 255 in the recess regions 245L, 245, and 245U. Among the gate electrodes 257L, 257, and 257U, a lowermost gate electrode 257L corresponds to a gate of the lower selection transistor and an uppermost gate electrode 257U corresponds to a gate of the upper selection transistor. The gate electrodes 257 between the lowermost and uppermost gate electrodes 257L and 257U correspond to control gates of the memory cells, respectively.

The alternately stacked gate electrodes 257L, 257, and 257U and insulation patterns 220a and 220Ua are defined as a stacked structure. A plurality of stacked structures extending in the first direction are spaced apart from each other in the second direction. First to third gap regions G1, G2, and G3 are defined between the plurality of stacked structures. According to an embodiment, in the second direction, widths of the gap regions G1, G2, and G3 are the same, substantially the same or different from each other.

According to an embodiment, lower portions of the gap regions G1, G2, and G3 contact the information storage layer 250. According to an embodiment, while the gate electrodes 257L, 257, and 257U are formed by etching the gate conductive layer 255, the information storage layer 250 is removed from an area outside of the recess regions 245L, 245, and 245U, so that lower portions of the gap regions G1, G2, and G3 contact a top surface of the substrate 200.

Figure 15A:
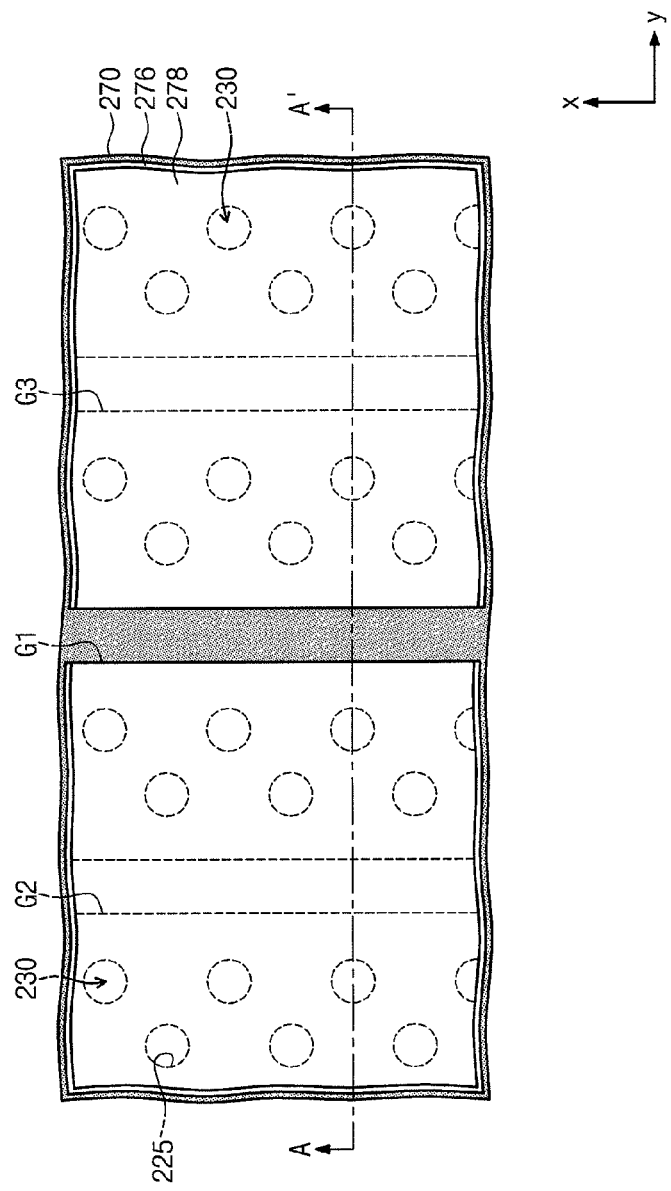
Figure 15B:
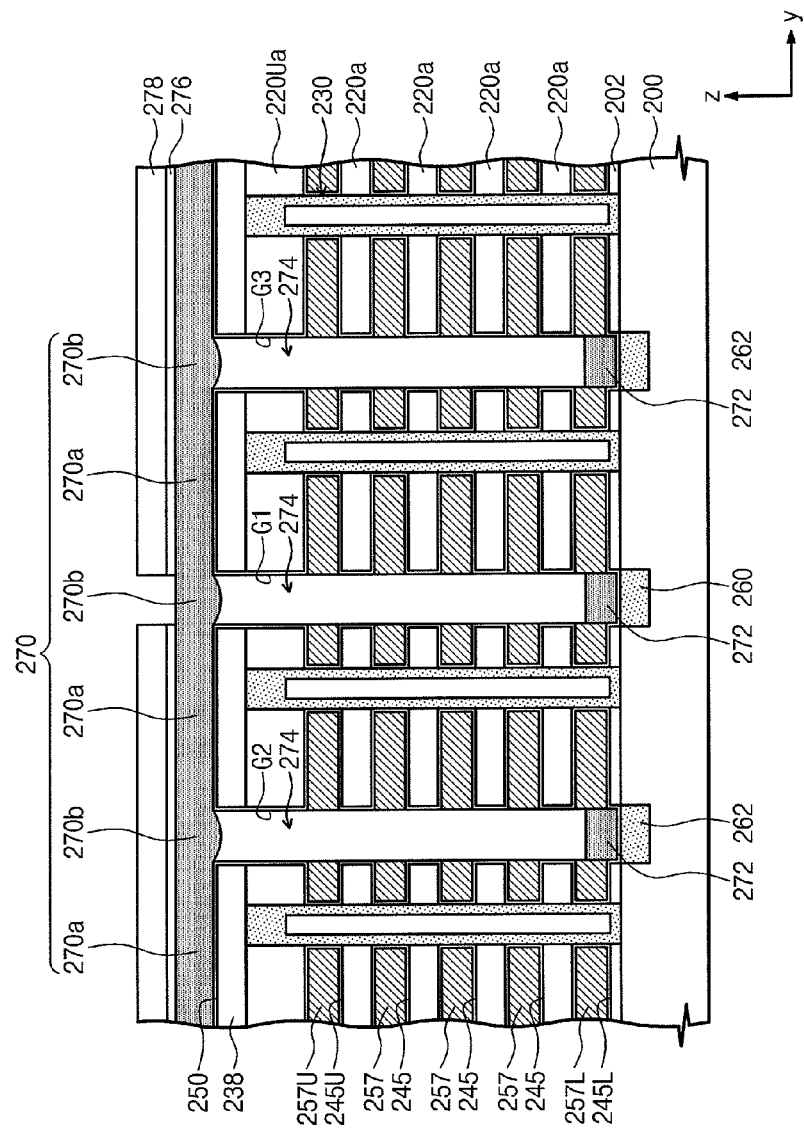

Referring to FIGS. 15A and 15B, a hard mask layer 270 is formed on the substrate 100. The hard mask layer 270 includes first portions 270a and second portions 270b. The first portions 270a cover top surfaces of the stacked structures. The second portions 270b block inlets of the gap regions G1, G2 and G3. Bottom surfaces of the second portions 270b protrude toward lower portions of the gap regions G1, G2, and G3. Based on a top surface of the substrate 200, lowermost surfaces of the second portions 270b have a higher level than a level of lower portions of the gap regions G1, G2, and G3. For example, the lowest surfaces of the second portions 270b are positioned higher than the lower portions of the gap regions G1, G2, and G3.

The forming of the hard mask layer 270 includes forming dropping portions 272 filling lower regions of the gap regions G1, G2, and G3. The dropping portions 272 extend in the first direction. The dropping portions 272 are formed during a forming process of the hard mask layer 270. The dropping portions 272 are formed using the same material as the hard mask layer 270. For example, during the forming of the hard mask layer 270, a portion of material used for forming the hard mask layer 270 drops to the gap regions G1, G2, and G3, thereby forming the dropping portions 272.

The hard mask layer 270 and the dropping portions 272 are formed using a material and/or a process providing a lower step coverage property than a step coverage property provided by a material and/or a process forming a silicon oxide layer, a silicon nitride layer, and a photoresist layer. The hard mask layer 270 and the dropping portions 272 are formed of a material having a higher viscosity than a photoresist. For example, the hard mask layer 270 and the dropping portions 272 include an amorphous carbon layer formed through a chemical vapor deposition (CVD) method. Accordingly, the hard mask layer 270 is formed of a material having a lower degree of filling than the photoresist. The degree of filling is defined by the volume of a gap region filled with a predetermined material with respect to the total volume of the gap region. For example, the hard mask layer 270 is formed of an amorphous carbon layer.

According to an embodiment, the dropping portions 272 and the hard mask layer 270 are spaced apart from each other, and voids 274 are defined in the gap regions G1, G2, and G3. For example, the voids 272 are defined between the dropping portions 272 and the second portions 270b of the hard mask layer 270. According to an embodiment, a hard mask layer is formed on the sidewalls of the gap regions G1, G2, and G3. According to an embodiment, a portion of the hard mask layer covering the lower portions of the gap regions G1, G2, and G3 is connected to a portion of the hard mask layer blocking the inlets of the gap regions G1, G2, and G3.

An anti reflection pattern 276 and a photoresist pattern 278 are formed on the hard mask layer 270. The anti reflection pattern 276 and the photoresist pattern 276 do not cover a second portion 270b blocking the inlet of the first gap region G1 but cover a second portion 270b blocking the inlets of the second and third gap regions G2 and G3. Accordingly, the second portion 270b blocking the inlet of the first gap region G1 is exposed.

Figure 16B:
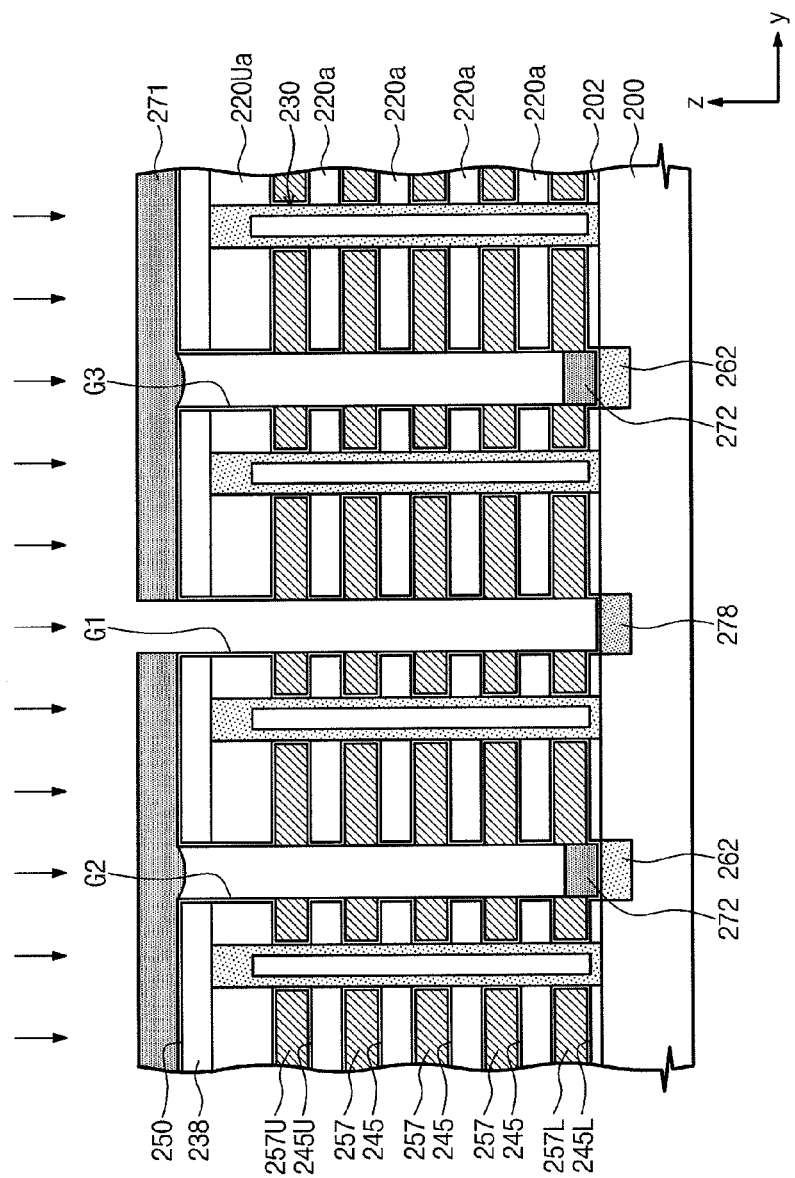

Referring to FIGS. 16A and 16B, after the photoresist pattern 278 is removed, the second portion 270b blocking the inlet of the first gap region G1 and the dropping portion 272 in the first gap region G1 are removed using the anti reflection pattern 276 as a mask. Accordingly, a hard mask pattern 271 blocking the inlets of the second and third gap regions G2 and G3 and covering top surfaces of the stacked structures are formed. A lower portion of the first gap region G1 is exposed.

If the hard mask pattern 271 and the dropping portions 272 are formed of an amorphous carbon layer, the second portion 270b blocking the inlet of the first gap region G1 and the dropping portion 272 in the first gap region G1 are easily removed through an ashing method using oxygen plasma.

By using the hard mask pattern 271 and the stacked structures as an ion implantation mask, first conductive type dopant ions are implanted into the substrate under the first gap region G1. Accordingly, the preliminary doping region 260 is counter-doped with the first conductive type dopant, thus forming a pick-up region 278. The pick-up region 278 extends in the first direction in the substrate 200 under the first gap region G1. A concentration of the first conductive type dopant of the pick-up region 278 is higher than a concentration of the first conductive type dopant of the substrate 200. Due to the hard mask pattern 271, the first conductive dopant ions not be implanted in the common source regions 262.

According to an embodiment of the inventive concept, the forming of the pick-up region 278 includes forming the hard mask layer 270 blocking the inlets of the gap regions G1, G2, and G3, forming the dropping portions 272 in the gap regions G1, G2, and G3, patterning the hard mask layer 270 to expose the inlet of the first gap region G1, and removing the dropping portion 272 in the first gap region G1. The hard mask layer 270 and the dropping portions 272 are formed using a material and/or a process providing low step coverage, so that the gap regions G1, G2, and G3 are not completely filled with the dropping portions 272. According to an embodiment, the dropping portions 272 are formed of a material (e.g., an amorphous carbon layer) that may be easily removed.

Accordingly, in the case that an aspect ratio of the gap regions G1, G2, and G3 is high, the dropping portions 272 in the gap regions G1, G2, and G3 are selectively easily removed. Accordingly, the first conductive type dopant is easily implanted in the substrate under the first gap region G1. As a consequence, a highly reliable semiconductor device may be formed.

A method of forming the pick-up region 278 according to an embodiment of the inventive concept may also apply when widths of the gap regions G1, G2, and G3 are different from each other (e.g., a width of the first gap region G1 is broader than widths of the second and third gap regions G2 and G3) as well as when the widths of the gap regions G1, G2, and G3 are the same. Accordingly, a semiconductor device may be manufactured by a simplified method, thus increasing a yield of semiconductor devices.

Figure 17A:
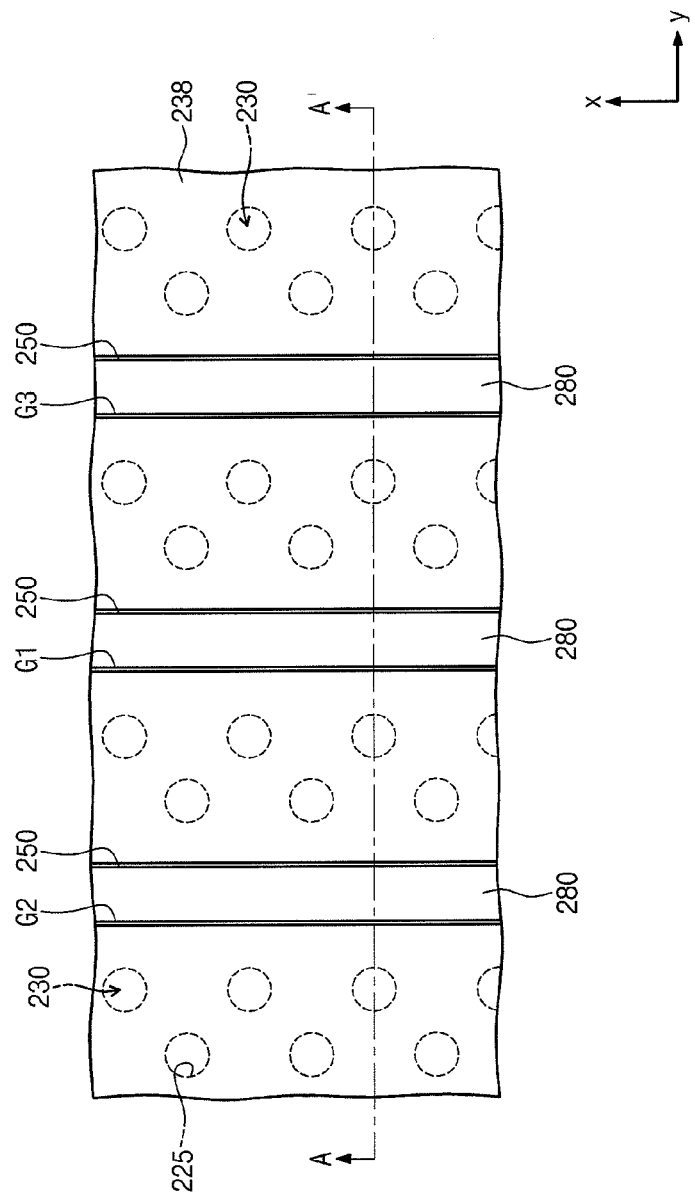
Figure 17B:
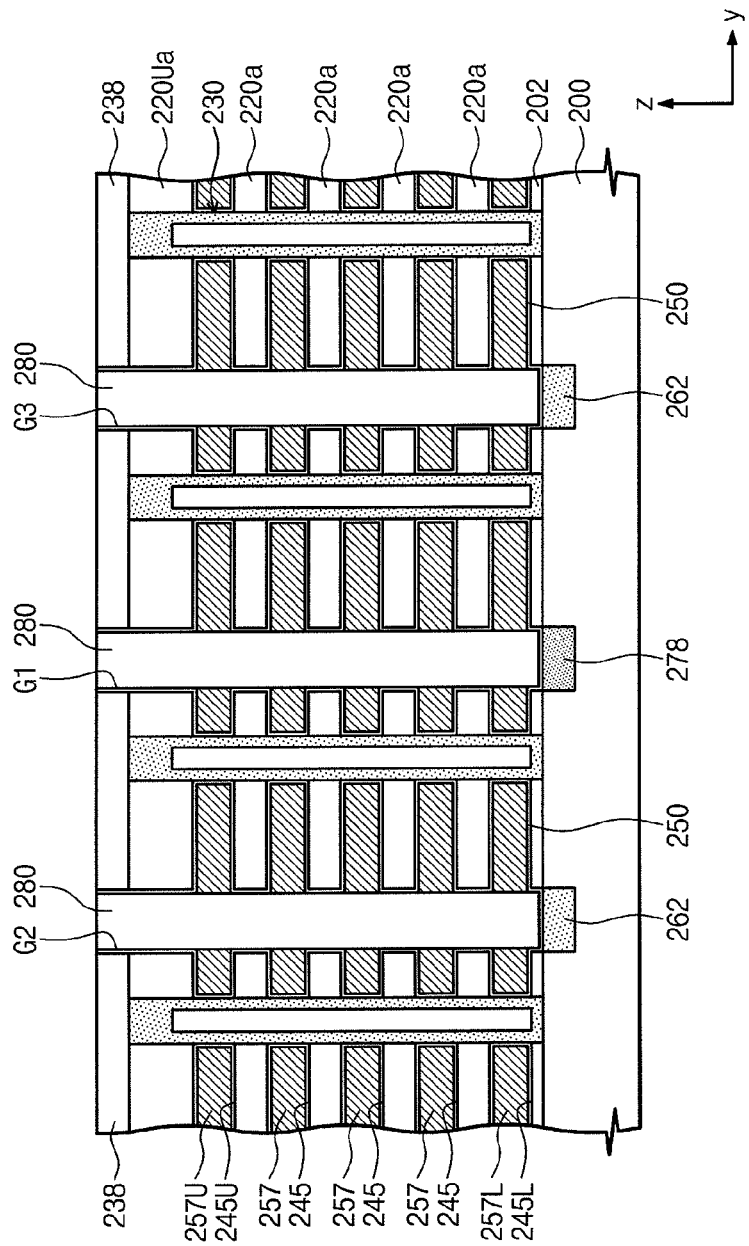

Referring to FIGS. 17A and 17B, after the forming of the pick-up region 278, the hard mask pattern 271 and the dropping portions 272 in the gap regions G2, and G3 are removed. According to an embodiment, if the hard mask pattern 271 and the dropping portions 272 include an amorphous carbon layer, the hard mask pattern 271 and the dropping portions 272 are removed through oxygen plasma ashing.

After removal of the hard mask pattern 271 and the dropping portions 272, gap fill insulation patterns 280 filling the gap regions G1, G2, and G3 are formed. The gap fill insulation patterns 280 completely fill the gap regions G1, G2, and G3. The gap fill insulation patterns 280 are obtained by forming an insulation layer filling the gap regions G1, G2, and G3 on the substrate 200 and by performing a planarization process on the insulation layer by using the capping patterns 238 as an etch stop layer. The planarization process includes chemical mechanical polishing or etch back. The insulation layer includes at least one of a silicon oxide layer, a silicon nitride layer, or a silicon oxynitride layer.

Figure 18A:
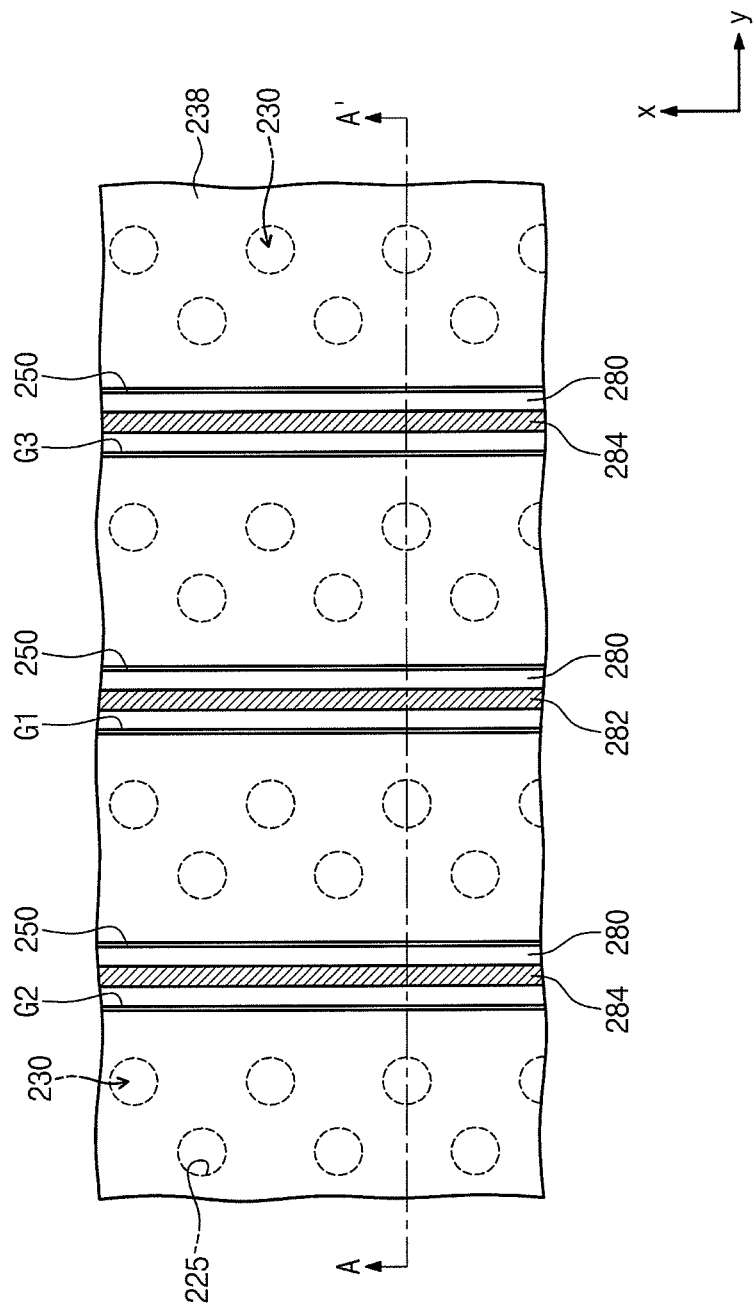
Figure 18B:
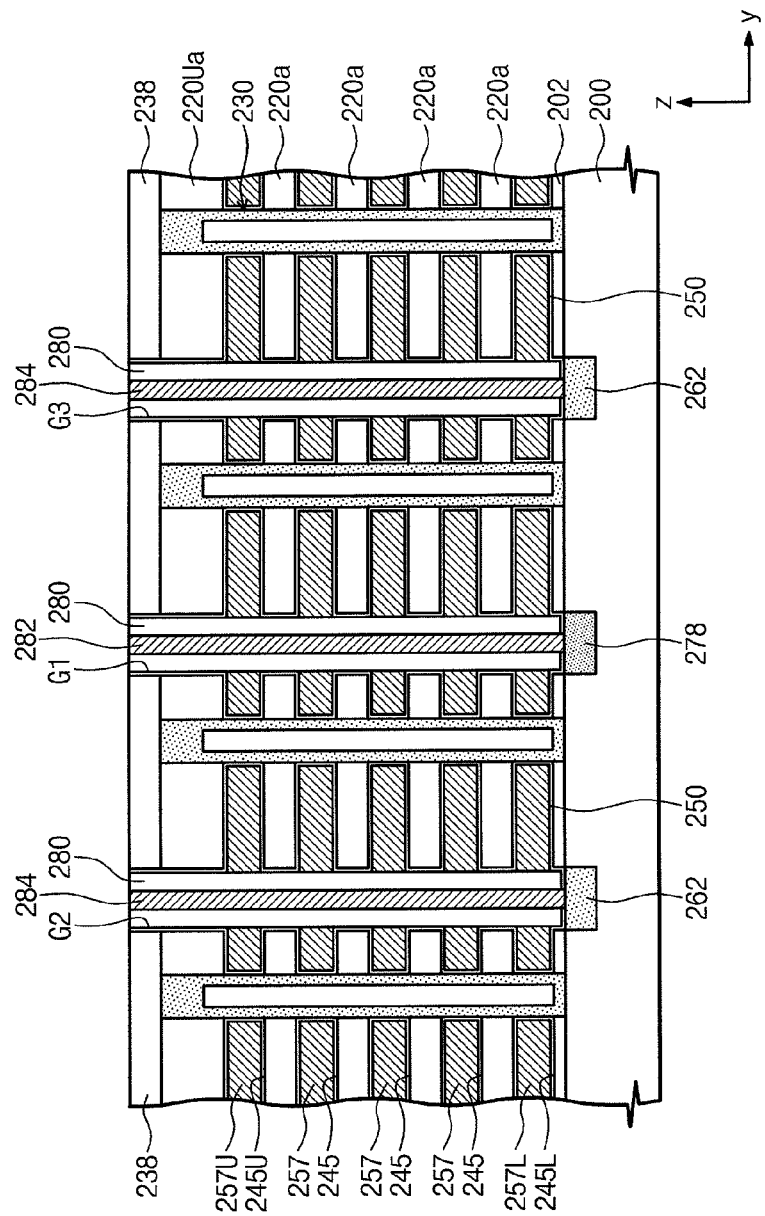

Referring to FIGS. 18A and 18B, contact patterns 282 and 284 penetrating the gap fill insulation patterns 280 are formed. The contact patterns 282 extend in the first direction in the gap regions G1, G2, and G3. The contact patterns 282 have a flat plate shape vertical to a top surface of the substrate 200. A pick-up contact pattern 282 is connected to the pick-up region 278 and common source contact patterns 284 are connected to the common source regions 262. The contact patterns 282 and 284 are obtained by patterning the gap fill insulation patterns 280 to form grooves extending in the first direction in the gap regions G1, G2, and G3 and by filling the grooves with a conductive layer. The patterned gap fill insulation patterns 280 disposed between the contact patterns 282 and 284 and the gate electrodes 257L, 257, and 257U are defined as insulation spacers.

Referring back to FIG. 6, a first conductive line 286 and second conductive lines 288 connecting to the pick-up contact pattern 282 and the source contact patterns 284, respectively, are formed. The first and second conductive lines 286 and 288 are arranged side by side and extend in the first direction. Widths of the first and second conductive lines 286 and 288 are the same. An interlayer insulation layer 290 is formed on the first and second conductive lines 286 and 288. Bit line contact holes penetrating the interlayer insulation layer 290 and the capping insulation patterns 238 to expose the capping semiconductor patterns 236 are formed. Bit line contact plugs 292 are formed in the bit line contact holes and bit lines 294 connecting the bit line contact plugs 292 are formed. The bit lines 294 extend in the second direction. For example, the bit lines 294 cross over the gate electrodes 257L, 257, and 257U. The bit lines 294 are parallel to each other. The bit lines 294 are electrically connected to respective columns of capping semiconductor patterns 236 arranged in the second direction.

It has been described that the contact patterns 282 and 284 extend in the first direction in the gap regions G1, G2, and G3, and have a flat plate shape vertical to a top surface of the substrate 200. According to an embodiment, however, the contact patterns 282 and 284 may have a pillar shape. An example will be described with reference to FIGS. 19A and 19B.

Figure 19A:
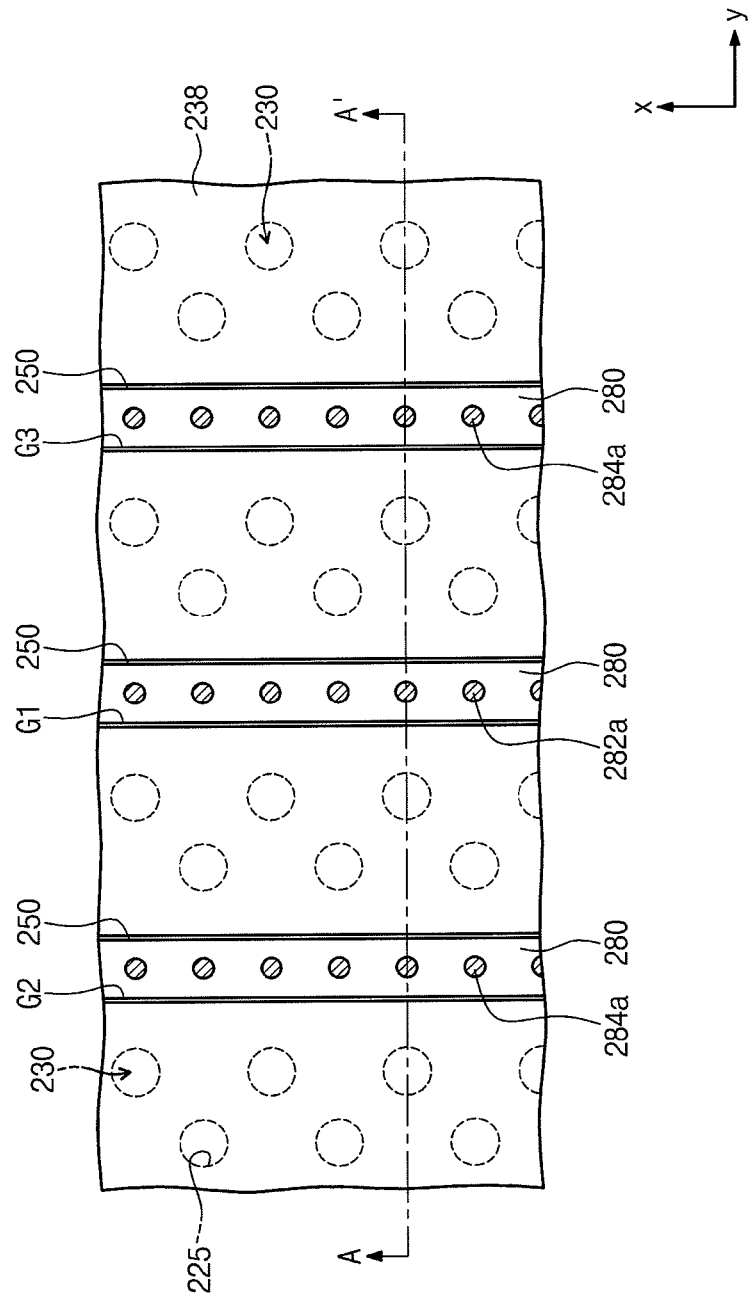
FIG. 19A is a plan view illustrating a method of fabricating a semiconductor device according to an embodiment of the inventive concept.
Figure 19B:
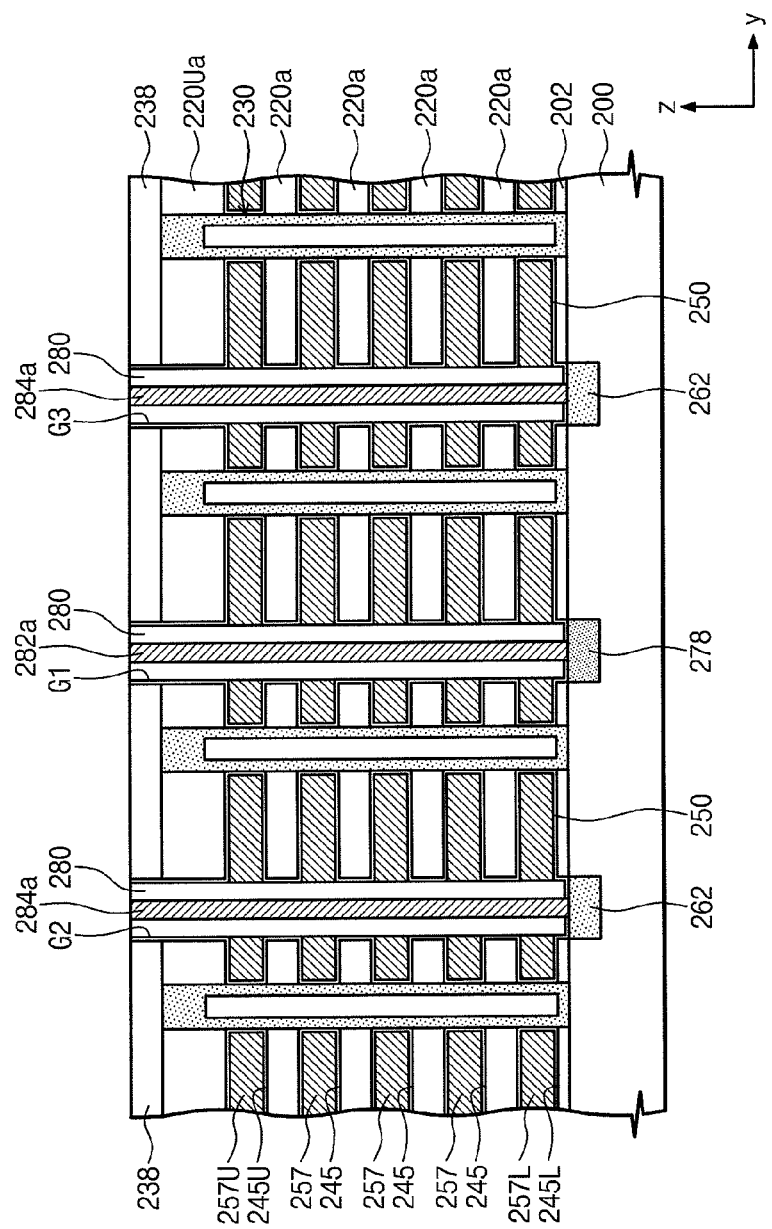
FIG. 19B is a sectional view taken along the line A-A' of FIG. 19A.

FIG. 19A is a plan view illustrating a method of fabricating a semiconductor device according to an embodiment of the inventive concept. FIG. 19B is a sectional view taken along the line A-A' of FIG. 19A.

Referring to FIGS. 19A and 19B, a method of fabricating a semiconductor device according to FIGS. 8A through 17B is provided. Contact patterns 282a and 284a penetrating cap fill insulation patterns 280 are formed. The contact patterns 282a and 284a are vertical to a top surface of the substrate 200. A pick-up contact pattern 282a is connected to a pick-up region 278, and common source contact patterns 284a are connected to the common source regions. The contact patterns 282a and 284a are obtained by patterning the gap fill insulation patterns 280 to form contact holes in the gap regions G1, G2, and G3 and by filling the contact holes with a conductive layer.

Hereinafter, as described with reference to FIG. 6, a first conductive line 286 and second conductive lines 288 connecting to the pick-up contact pattern 282a and the source contact patterns 284a, respectively, are formed, and an interlayer insulation layer 290, bit line contact plugs 292, and bit lines 294 are formed.

The semiconductor devices according to the above-described embodiments are realized in various forms of semiconductor packages. For example, the semiconductor devices are packaged through Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP). A package where semiconductor devices according to the embodiments of the inventive concept are mounted may further include a controller controlling the semiconductor devices and/or a logic device.

Figure 20:
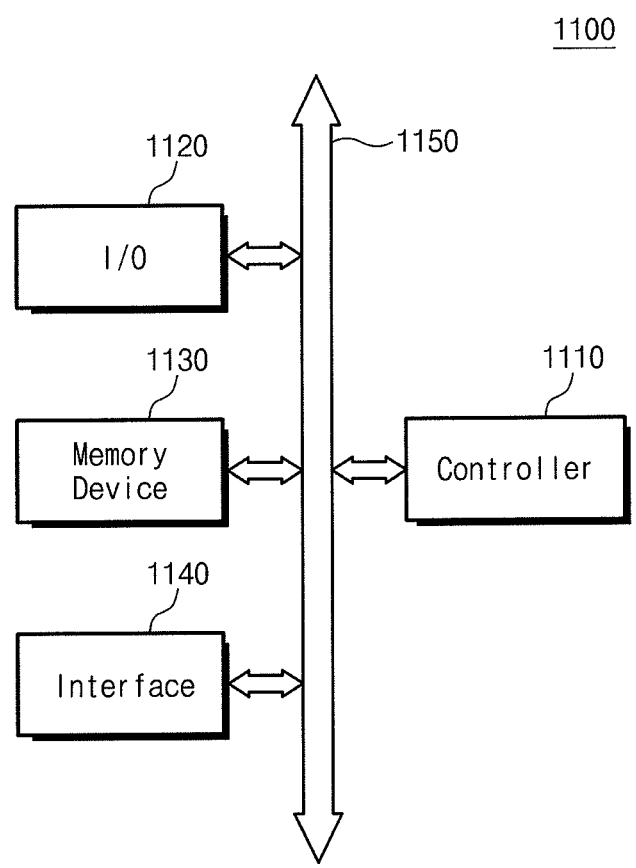
FIG. 20 is a block diagram illustrating an example of an electronic system including a semiconductor device according to an embodiment of the inventive concept.

FIG. 20 is a block diagram illustrating an example of an electronic system including a semiconductor device according to an embodiment of the inventive concept.

Referring to FIG. 20, the electronic system 1100 includes a controller 1110, an input/output device (or I/O) 1120, a memory device 1130, an interface 1140, and a bus 1150. The controller 1110, the input/output device 1120, the memory device 1130, and/or the interface 1140 are connected to each other through the bus 1150. The bus 1150 corresponds to a path through which data passes.

The controller 1110 includes at least one of a micro processor, a digital signal processor, a micro controller, or other processors similar thereto. The input/output device 1120 includes a keypad, a keyboard, and a display device. The memory device 1130 stores data and/or commands. The memory device 1130 includes at least one of the semiconductor devices according to the embodiments of the inventive concept. According to an embodiment, the memory device 1130 further includes different forms of semiconductor memory devices (e.g., a DRAM device and/or an SRAM device). The interface 1140 transmits or receives data through a communication network. The interface 1140 has a wired or wireless form. For example, the interface 1140 includes an antenna or a wired/wireless transceiver. Although not shown in the drawings, according to an embodiment, the electronic system 1100 further includes a high-speed DRAM and/or SRAM as an operating memory for improving an operation of the controller 1110.

The electronic system 1100 may be applied to a PDA, a portable computer, a web tablet, a wireless phone, a mobile phone, a digital music player, a memory card, or all devices for transmitting and receiving information via a wireless environment.

Figure 21:
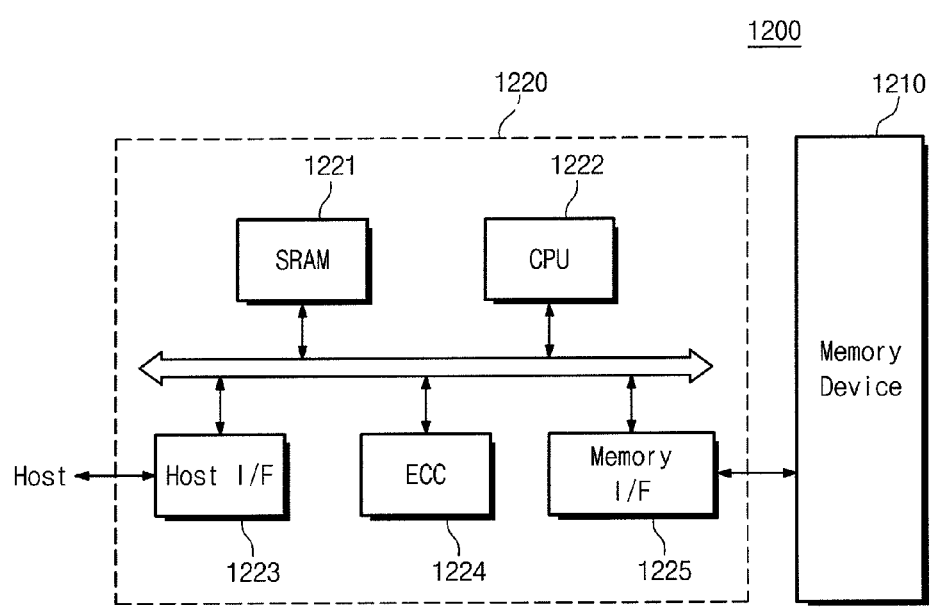
FIG. 21 is a block diagram illustrating an example of a memory card with a semiconductor device according to an embodiment of the inventive concept.

FIG. 21 is a block diagram illustrating an example of a memory card with a semiconductor device according to an embodiment of the inventive concept.

Referring to FIG. 21, the memory card 1200 includes a memory device 1210. The memory device 1210 includes at least one of the semiconductor devices according to the embodiments of the inventive concept. According to an embodiment, the memory device 1210 further includes different forms of semiconductor memory devices (e.g., a DRAM device and/or an SRAM device). The memory card 1200 includes a memory controller 1220 controlling data exchange between a host and the memory device 1210.

The memory controller 1220 includes a central processing unit (CPU) 1222 controlling general operations of a memory card. The memory controller 1220 includes an SRAM 1221 used as an operating memory of the CPU 1222. The memory controller 1200 further includes a host interface 1223 and a memory interface 1225. The host interface 1223 includes a data exchange protocol between the memory card 1200 and a host. The memory interface 1225 connects the memory controller 1220 to the memory device 1210. The memory controller 1220 further includes an error correction code block (ECC) 1224. The ECC 1224 detects and corrects errors in data read from the memory device 1210. Although not shown in the drawings, the memory card 1200 further includes a ROM device storing code data to interface with a host. According to an embodiment, the memory card 1200 may be used as a portable data storage card. According to an embodiment, the memory card 1200 may be realized as a solid state disk (SSD) that may replace a hard disk of a computer system.

According to the embodiments of the inventive concept, stacked structures, each including stacked gate electrodes spaced apart from each other, are disposed on a first conductive type substrate, and a first conductive type pick-up region is provided in the substrate between a pair of stacked structures. As a consequence, a voltage is stably supplied to the substrate through the pick-up region connected electrically to the substrate. Accordingly, a semiconductor device with increased reliability may be realized.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor device comprising:
   a substrate doped with a first conductive type dopant;
   a plurality of stacked structures arranged side by side on the substrate and extending in a first direction, each of the stacked structures including gate electrodes spaced apart from each other, the plurality of stacked structures including a pair of stacked structures spaced apart from each other at a first interval in a second direction perpendicular to the first direction;
   a plurality of semiconductor pillars penetrating the plurality of stacked structures to connect to the substrate;
   a pick-up region extending in the first direction in the substrate between the pair of stacked structures and doped with the first conductive type dopant, wherein the semiconductor pillars do not overlap the pick-up region;
   a pick-up contact pattern connected to the pick-up region and extending in the first direction between the pair of stacked structures, wherein the pair of stacked structures comprises first and second stacked structures, and wherein the plurality of stacked structures further comprise as third stacked structure adjacent to the second stacked structure and spaced apart from the second stacked structure at a second interval, in the second direction; and
   a source contact pattern disposed on the substrate between the second and third stacked structures.

2. The semiconductor device of claim 1, wherein a concentration of the first conductive type dopant is higher in the pick-up region than in the substrate.

3. The semiconductor device of claim 1, wherein the pick-up contact pattern has a plate shape perpendicular to a top surface of the substrate, wherein the pick-up contact pattern has a length in the first direction and a width in the second direction, the length being larger than the width.

4. The semiconductor device of claim 1, wherein
the second interval is narrower than the first interval,
the semiconductor device further comprising a common source region connected to the source contact pattern and extending in the first direction in the substrate between the second and third stacked structures, wherein the common source region has a second conductive type different from the first conductive type, and the common source region is spaced apart from the pick-up region.

5. The semiconductor device of claim 1, further comprising insulation spacers on two sidewalls of each of the plurality of stacked structures, wherein the insulation spacers are spaced apart from the semiconductor pillars.

6. The semiconductor device of claim 1, further comprising second conductive type remaining doping regions extending in the first direction in the substrate between the pair of stacked structures and disposed at two sides of the pick-up region.

7. The semiconductor device of claim 1, further comprising an information storage layer between the plurality of semiconductor pillars and the gate electrodes.

8. The semiconductor device of claim 1, wherein the pick-up region has a line shape having a length in the first direction and a width in the second direction, the length is larger than the width.

9. The semiconductor device of claim 1, wherein the pick-up region is not formed in the substrate underneath the pair of stacked structures.

10. A semiconductor device, comprising:
a substrate doped with a first conductive type dopant;
a plurality of stacked structures arranged side by side on the substrate and extending in a first direction, each of the stacked structures including gate electrodes spaced apart from each other, the plurality of stacked structures including a pair of stacked structures spaced apart from each other at a first interval in a second direction perpendicular to the first direction;
a pick-up region extending in the first direction in the substrate between the pair of stacked structures and doped with the first conductive type dopant; and
a pick-up contact pattern connected to the pick-up region and extending in the first direction between the pair of stacked structures, wherein the pick-up contact pattern has a plate shape perpendicular to a top surface of the substrate, wherein the pair of stacked structures comprises first and second stacked structures; and the plurality of stacked structures further comprise a third stacked structure adjacent to the second stacked structure and spaced apart from the second stacked structure at a second interval in the second direction, the second interval being narrower than the first interval;
a second conductive type common source region extending in the first direction in the substrate between the second and third stacked structures; and
a source contact pattern connected to the common source region and extending in the first direction between the second and third stacked structures.

11. The semiconductor device of claim 10, wherein the source contact pattern has a plate shape perpendicular to a top surface of the substrate.

12. The semiconductor device of claim 10, wherein
the pick-up contact pattern comprises a main contact portion and auxiliary contact potions at two sides of the main contact portion, and wherein
the auxiliary contact portions comprise the same material as the source contact pattern.

13. A semiconductor device, comprising:
a substrate doped with a first conductive type dopant;
a plurality of stacked structures arranged side by side on the substrate and extending in a first direction, each of the stacked structures including gate electrodes spaced apart from each other, the plurality of stacked structures including a pair of stacked structures spaced apart from each other at a first interval in a second direction perpendicular to the first direction;
a plurality of semiconductor pillars penetrating the plurality of stacked structures to connect to the substrate;
a pick-up region extending in the first direction in the substrate between the pair of stacked structures and doped with the first conductive type dopant, wherein the semiconductor pillars do not overlap the pick-up region;
a pick-up contact pattern connected to the pick-up region and extending in the first direction between the pair of stacked structures; and
a common source region disposed on the substrate, wherein the common source region has a second conductive type different from the first conductive type, and wherein the common source region is spaced apart from the pick-up region.

14. The semiconductor device of claim 13, wherein a concentration of the first conductive type dopant is higher in the pick-up region than in the substrate.

15. The semiconductor device of claim 13, wherein the pick-up contact pattern has a plate shape perpendicular to a top surface of the substrate, wherein the pick-up contact pattern has a length in the first direction and a width in the second direction, the length being larger than the width.

16. The semiconductor device of claim 13, wherein the pair of stacked structures comprises first and second stacked structures; and
the plurality of stacked structures further comprise a third stacked structure adjacent to the second stacked structure and spaced apart from the second stacked structure at a second interval in the second direction, the second interval being narrower than the first interval.

17. The semiconductor device of claim 13, further comprising insulation spacers on two sidewalk of each of the plurality of stacked structures, wherein the insulation spacers are spaced apart from the semiconductor pillars.

18. The semiconductor device of claim 13, further comprising second conductive type remaining doping regions extending in the first direction in the substrate between the pair of stacked structures and disposed at two sides of the pickup region.

19. The semiconductor device of claim 13, further comprising an information storage layer between the plurality of semiconductor pillars and the gate electrodes.

20. The semiconductor device of claim 13, wherein the pick-up region has a line shape having a length in the first direction and a width in the second direction, the length is larger than the width.

* * * * *